(12) United States Patent
Niwa et al.

(10) Patent No.: US 9,046,279 B2
(45) Date of Patent: Jun. 2, 2015

(54) LIGHT CONDENSING DEVICE, PHOTOVOLTAIC POWER GENERATION DEVICE AND PHOTO-THERMAL CONVERSION DEVICE

(71) Applicant: NIKON CORPORATION, Tokyo (JP)

(72) Inventors: Tatsuo Niwa, Sakura (JP); Wakana Uchida, Fuchu (JP); Tatsuya Senga, Kawasaki (JP); Takahiro Kurashima, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/256,654

(22) Filed: Apr. 18, 2014

(65) Prior Publication Data

US 2014/0224301 A1    Aug. 14, 2014

Related U.S. Application Data

(63) Continuation of application No. PCT/JP2012/077151, filed on Oct. 19, 2012.

(30) Foreign Application Priority Data

Oct. 19, 2011  (JP) ................. 2011-230125

(51) Int. Cl.
*H01L 31/052* (2014.01)
*F24J 2/06* (2006.01)
(Continued)

(52) U.S. Cl.
CPC *F24J 2/062* (2013.01); *Y02E 10/52* (2013.01); *G02B 3/005* (2013.01); *G02B 5/045* (2013.01);
(Continued)

(58) Field of Classification Search
CPC ............ H01L 31/0524; H01L 31/0543; H01L 31/054; H01L 31/0547
USPC .................................................. 136/246, 256
See application file for complete search history.

(56) References Cited

U.S. PATENT DOCUMENTS 3,758,197 A * 9/1973 Klang et al. ................. 359/833
4,069,812 A * 1/1978 O'Neill ........................ 136/246
(Continued)

FOREIGN PATENT DOCUMENTS

JP    A-06-275859    9/1994
JP    A-10-221528    8/1998
(Continued)

OTHER PUBLICATIONS

Karp et al., "Planar micro-optic solar concentrator," *Optics Express*, Jan. 18, 2010, pp. 1122-1133, vol. 18, No. 2, Optical Society of America.
(Continued)

*Primary Examiner* — Golam Mowla
(74) *Attorney, Agent, or Firm* — Oliff PLC

(57) ABSTRACT

A first prism member includes a plurality of light condensing structures that are formed at the front surface and condense the light having entered thereat and a plurality of deflecting structures which deflect light having been condensed via the light condensing structures and output the deflected light; a second prism member includes an entrance surface set so as to face opposite the rear surface of the first prism member; and the light having been deflected and output by the deflecting structures of the first prism member enters the second prism member through the entrance surface of the second prism member, is guided toward the exit surface as the light is reflected at the reflecting structure and at the entrance surface inside the second prism member, and exits through the exit surface.

13 Claims, 23 Drawing Sheets

(51) Int. Cl.
*G02B 3/00* (2006.01)
*G02B 5/04* (2006.01)
*G02B 19/00* (2006.01)
*H01L 31/054* (2014.01)
*F21V 8/00* (2006.01)

(52) U.S. Cl.
CPC ........ *G02B 19/0014* (2013.01); *G02B 19/0038* (2013.01); *G02B 6/0053* (2013.01); *F24J 2/067* (2013.01); *Y02E 10/40* (2013.01); *G02B 6/0046* (2013.01); *H01L 31/0543* (2014.12); *H01L 31/0547* (2014.12)

(56) References Cited

U.S. PATENT DOCUMENTS 4,377,154 A * 3/1983 Meckler ........................ 126/603
5,977,478 A 11/1999 Hibino et al.
2008/0271776 A1 11/2008 Morgan
2010/0202142 A1 8/2010 Morgan
2011/0310633 A1 12/2011 Morgan
2012/0019942 A1 1/2012 Morgan
2012/0216863 A1 * 8/2012 Wen et al. ..................... 136/259

FOREIGN PATENT DOCUMENTS

| JP | A-2010-266629 | 11/2010 |
| JP | A-2011-054476 | 3/2011 |
| JP | A-2012-189280 | 10/2012 |
| WO | WO 2011/074108 A1 | 6/2011 |

OTHER PUBLICATIONS

International Search Report issued in International Application No. PCT/JP2012/077151 dated Nov. 20, 2012.

* cited by examiner

SHAPE-DEFINED LIGHT CONDENSING MALTIPLICATION FACTOR = $1/\tan\varepsilon$

TOTAL REFLECTION AT LOWER SURFACE : $\varepsilon = \arcsin(\frac{1}{n}) - \arcsin(\frac{\sin\theta}{n})$ LOWER SURFACE FORMED AS MIRROR SURFACE : $\varepsilon = \frac{1}{2}\left\{\arcsin(\frac{1}{n}) - \arcsin(\frac{\sin\theta}{n})\right\}$

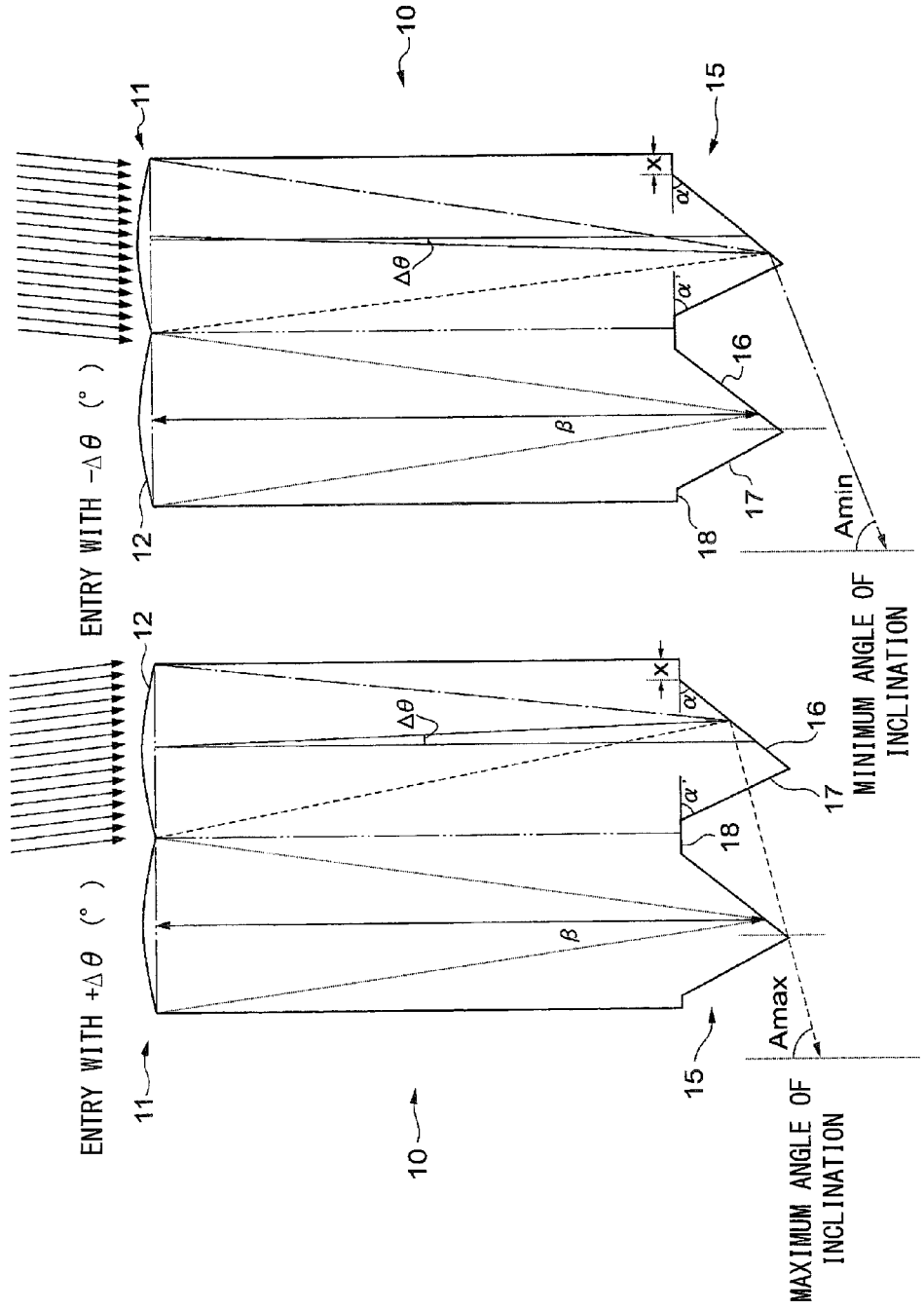

LIGHT CONDENSING DEVICE, PHOTOVOLTAIC POWER GENERATION DEVICE AND PHOTO-THERMAL CONVERSION DEVICE

INCORPORATION BY REFERENCE

This continuation application claims the benefit of PCT/JP2012/077151 filed Oct. 19, 2012. This application also claims priority from Japanese Application No. 2011-230125 filed Oct. 19, 2011. The disclosures of the following applications are herein incorporated by reference:

Japanese Patent Application No. 2011-230125 (filed on Oct. 19, 2011)

International Application No. PCT/JP2012/077151 (filed on Oct. 19, 2012).

BACKGROUND OF THE INVENTION

1. Field of the Invention

The present invention relates to a light condensing device that condenses light having entered through a front surface thereof along the direction running toward a side surface, and a photovoltaic power generation device and a photo-thermal conversion device both achieved by adopting the light condensing device.

2. Description of Related Art

A light condensing device known in the related art that condenses light having entered through a front surface onto a side surface, includes a prism member having an entrance surface through which solar light enters and a bottom surface that intersects the entrance surface at an acute angle. The prism member condenses the solar light having entered through the entrance surface by causing it to be reflected a plurality of times between the bottom surface and the entrance surface.

FIG. 22 illustrates the basic concept of the light condensing device described above. The light condensing device 9 is configured with a prism member 90 having an entrance surface 91 through which solar light enters, a bottom surface 92 that intersects the entrance surface 91 by forming a vertex angle $\epsilon$ and reflects the incident light and an exit surface 95 that intersects the entrance surface 91 substantially at a right angle. The prism member 90 is formed so as to achieve a prismatic or wedge-shaped section. A photovoltaic power generation device is configured by disposing a photoelectric conversion element (solar cell) 5 at the exit surface 95, where the condensed light undergoes photoelectric conversion.

Assuming that the prism member 90 has a length L, measured along the horizontal direction, a height H, measured along the thickness direction thereof and a uniform width measured along the direction running perpendicular to the drawing sheet, the light condensing multiplication factor of this light condensing device 9 is generally defined as; (entrance surface area)/(exit surface area)=L/H. In this description, the light condensing multiplication factor defined based upon the geometric shape of the light condensing device as described above will be referred to as a "shape-defined light condensing multiplication factor". The expression above indicates that in order to improve the shape-defined light condensing multiplication factor, the vertex angle $\epsilon$ must be set smaller.

However, when a smaller vertex angle $\epsilon$ is formed, the angle of incidence with which the light, having entered through the entrance surface 91, enters the bottom surface 92 also becomes smaller. Under such circumstances, the incident light will be transmitted through the bottom surface 92 unless solar light enters the entrance surface 91 with a large angle of incidence $\theta$ within the drawing sheet surface on which FIG. 22 is presented. On the contrary, solar light enters the entrance surface 91 at a larger angle of incidence $\theta$, the light intensity (energy density) of the solar light entering through the entrance surface 91 per unit area is bound to be lowered. As a result, it is difficult to efficiently condense the optical energy in the solar light.

A light condensing device proposed in the related art includes a bottom surface 92 formed as a mirror surface by vapor-depositing a metal film at the bottom surface 92 or bonding a reflecting mirror at the bottom surface 92 and condenses incident light onto an exit surface 95 by alternately causing specular reflection at the bottom surface 92 and total reflection at the entrance surface 91, so as to address this issue (see, for instance, Japanese Laid Open Patent Publication No. H6-275859).

SUMMARY OF THE INVENTION

However, even in the light condensing device with the bottom surface thereof formed as a mirror surface as described above, solar light having entered through the entrance surface at a small angle of incidence $\theta$ will eventually exit through the entrance surface after being reflected (specular reflection) at the bottom surface. Thus, there has been a great deal of ongoing interest in light condensing devices capable of condensing the optical energy of solar light with better efficiency. An object of the present invention, having been conceived to address the challenges discussed above, is to provide a light condensing device that will enable more efficient utilization of optical energy such as solar light. It is a further object of the present invention to provide a photovoltaic power generation device that enables efficient conversion of optical energy such as solar light to electric energy and a photo-thermal conversion device capable of converting optical energy such as solar light to thermal energy with a high degree of efficiency.

According to the first aspect of the present invention, a light condensing device, comprises: a first prism member where light, having entered therein through a front surface thereof, exits through a rear surface thereof; and a second prism member disposed so as to face opposite the rear surface of the first prism member, wherein: the first prism member includes a plurality of light condensing structures that are formed at the front surface and condense the light having entered thereat and a plurality of deflecting structures, each projecting out at the rear surface in correspondence to one of the plurality of light condensing structures, which deflect light having been condensed via the light condensing structures and output the deflected light; the second prism member includes an entrance surface set so as to face opposite the rear surface of the first prism member, a reflecting structure intersecting the entrance surface by forming an acute angle and an exit surface through which light exits; and the light having been deflected and output by the deflecting structures of the first prism member enters the second prism member through the entrance surface of the second prism member, is guided toward the exit surface as the light is reflected at the reflecting structure and at the entrance surface inside the second prism member, and exits through the exit surface.

According to the second aspect of the present invention, in the light condensing device of the first aspect, it is preferred that the deflecting structures of the first prism member each include a first surface at which the light having been condensed by the corresponding light condensing structure is reflected and a second surface through which the light having been reflected at the first surface is transmitted and exits the first prism member.

According to the third aspect of the present invention, in the light condensing device of the second aspect, it is preferred that the entrance surface of the second prism member includes a light guiding surface ranging substantially parallel to and facing opposite the second surface of the deflecting structure of the first prism member, through which the light having exited the first prism member through the second surface thereof enters, and a reflecting surface at which light having been reflected at the reflecting structure is reflected toward inside the second prism member.

According to the fourth aspect of the present invention, in the light condensing device of the third aspect, it is preferred that a bonding portion, having a refractive index substantially equal to the refractive index of the first prism member and the refractive index of the second prism member, is disposed between the second surface of the first prism member and the light guiding surface of the second prism member.

According to the fifth aspect of the present invention, in the light condensing device of the third aspect, it is preferred that a medium, having a refractive index lower than both the refractive index of the first prism member and the refractive index of the second prism member, is disposed between the first prism member and the reflecting surface of the second prism member.

According to the sixth aspect of the present invention, in the light condensing device of the second aspect, it is preferred that the light condensing device is configured so that; light, having exited through the second surface after being condensed at each of the condensing structures of the first prism member and reflected at the first surface, enters the second prism member through the entrance surface thereof without ever becoming blocked by an adjacent deflecting structure of the first prism member.

According to the seventh aspect of the present invention, in the light condensing device of the second aspect, it is preferred that the plurality of deflecting structures of the first prism member achieve a reiterative formation with the first surface and the second surface set alternately to each other.

According to the eighth aspect of the present invention, in the light condensing device of the first aspect, it is preferred that the light condensing structures of the first prism member are each formed as a curved surface protruding on a light entrance side; and the first surface is formed so that all the light having been condensed at the corresponding light condensing structure is totally reflected thereat.

According to the ninth aspect of the present invention, in the light condensing device of the first aspect, it is preferred that the light condensing structures of the first prism member are each formed with a plurality of flat surfaces so as to protrude out on a light entrance side; and the first surface is formed so that all the light having been condensed at the corresponding light condensing structure is totally reflected thereat.

According to the tenth aspect of the present invention, in the light condensing device of the first aspect, it is preferred that the reflecting structure of the second prism member is configured with a single flat surface and is structured so that when light, having advanced through the second prism member after exiting the first prism member and entering the second prism member through the entrance surface thereof, reaches the reflecting structure, the light is totally reflected at the reflecting structure.

According to the eleventh aspect of the present invention, in the light condensing device of the first aspect, it is preferred that the reflecting structure of the second prism member is configured with a flat surface and a mirror surface set so as to face opposite the flat surface via an air layer, and is structured so that when light, having advanced through the second prism member after exiting the first prism member and entering the second prism member through the entrance surface thereof, reaches the reflecting structure, the light is first transmitted through the flat surface, is reflected at the mirror surface, is transmitted through the flat surface again, advances through the second prism member and is totally reflected at the entrance surface toward inside the second prism member.

According to the twelfth aspect of the present invention, a photovoltaic power generation device, comprises: a light condensing device of the first aspect; and a photoelectric conversion element where light having been guided to the exit surface of the second prism member undergoes photoelectric conversion.

According to the thirteenth aspect of the present invention, a photo-thermal conversion device, comprises: a light condensing device of the first aspect; and a photo-thermal conversion element where light having been guided to the exit surface of the second prism member undergoes photo-thermal conversion.

BRIEF DESCRIPTION OF THE DRAWINGS

FIG. 13A and FIG. 13B are illustrations in reference to which the structure and the functions of the first prism member achieved in a variation of the first structure mode will be described.

DESCRIPTION OF PREFERRED EMBODIMENTS

Figure 1:
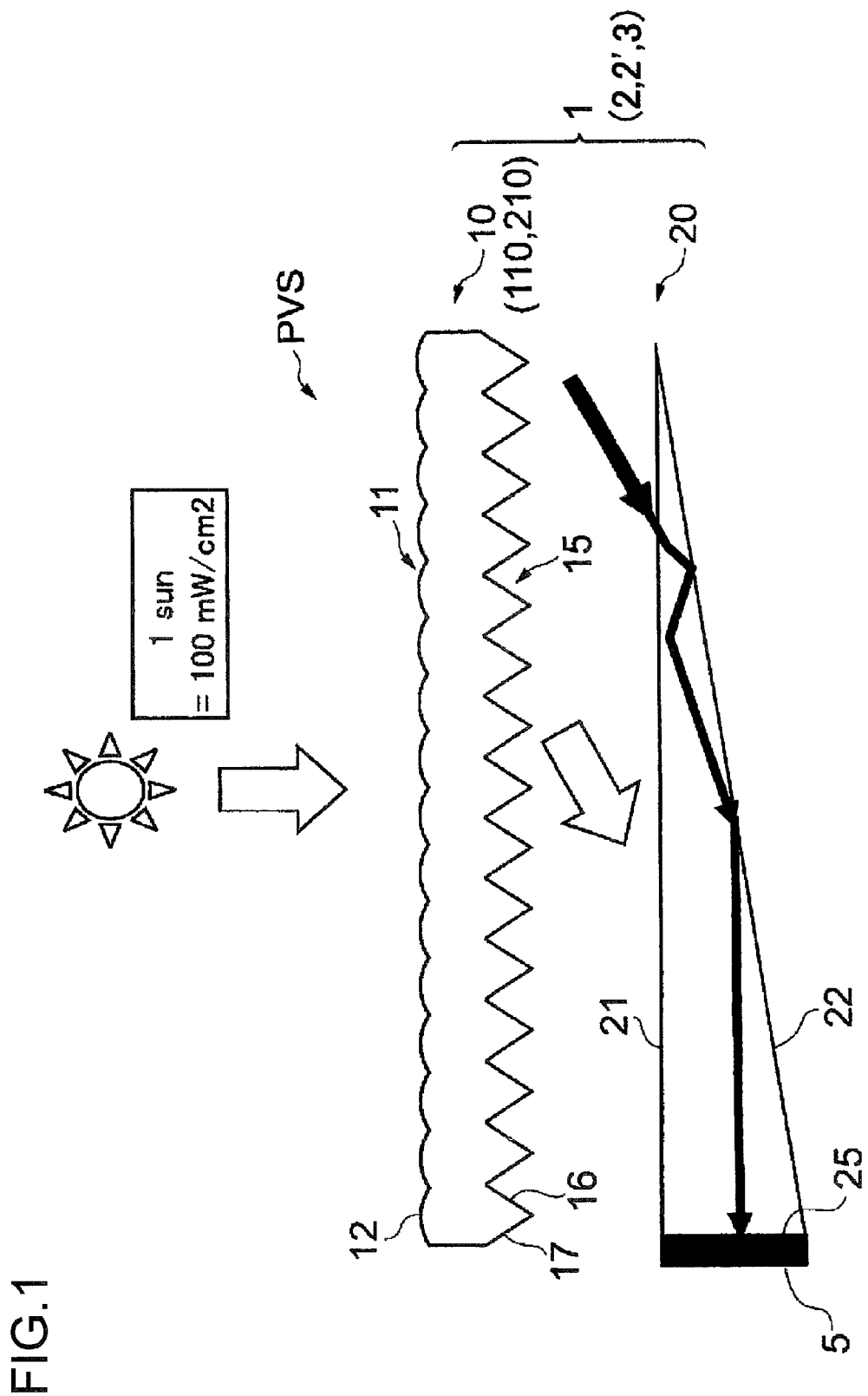
FIG. 1 is a schematic diagram illustrating the structure of a photovoltaic power generation device that may be achieved as an embodiment of the present invention.

The following is a description of embodiments of the present invention, given in reference to drawings. FIG. 1 provides a schematic diagram illustrating the structure of a photovoltaic power generation device PVS, achieved in an embodiment of the present invention, which includes a light condensing device 1 adopting a first structure mode. The photovoltaic power generation device PVS comprises the light condensing device 1 that condenses light and a photoelectric conversion element 5 at which the condensed light undergoes photoelectric conversion.

The light condensing device 1 is configured with a first prism member 10 that includes light condensing structures at a front surface thereof through which light enters, and deflects the light having entered therein along a diagonal direction so that the diagonally deflected light exits through a rear surface thereof, and a second prism member 20 that is disposed so as to face opposite the rear surface of the first prism member 10, condenses the light having exited the first prism 10 and guides the condensed light toward the photoelectric conversion element 5. The first prism member 10, the second prism member 20 and the photoelectric conversion element 5 are formed so as to extend along the front/rear direction running perpendicular to the drawing sheet. Namely, FIG. 1 shows the photovoltaic power generation device PVS in a sectional view. It is to be noted that while the following description is given by using directional terms up, down, left and right as defined relative to the attitude assumed in FIG. 1 so as to simplify the explanation, the photovoltaic power generation device PVS may be set in any orientation in correspondence to the direction in which the incoming light advances.

The second prism member 20 includes an entrance surface 21 through which the light having exited the first prism member 10 enters, a reflecting structure 22 that intersects the interior surface 21 with a vertex angle ϵ and reflects light, the advancing path of which has been deflected by the first prism member 10, and an exit surface 25 through which the light, having been reflected at the reflecting structure 22 and the entrance surface 21 and guided to the left, exits. FIG. 1 presents a structural example in which the photoelectric conversion element 5 is disposed at the exit surface 25.

Figure 2A:
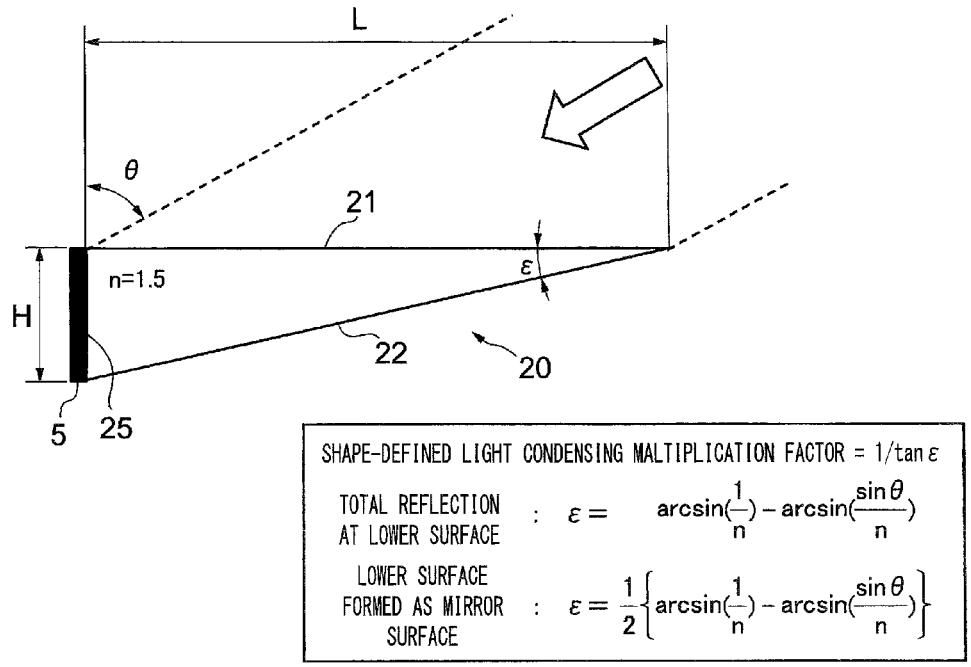
FIG. 2A and FIG. 2B are diagrams in reference to which the relationship between the angle of incidence of solar light and the shape-defined light condensing multiplication factor that may manifest when condensing solar light having entered the second prism member will be described.

Assuming that the entrance surface 21 has a length L, measured along the left/right direction, and that the exit surface 25 has a height H, measured along the top/bottom direction, the shape-defined light condensing multiplication factor of a second prism member 20 with a uniform width measured along the front/rear direction running perpendicular to the drawing sheet surface, is defined as L/H=1/tan ϵ, as indicated in FIG. 2A. This means that the shape-defined light condensing multiplication factor can be improved by minimizing the vertex angle ϵ. However, when a smaller vertex angle ϵ is formed, the angle of incidence at which the light, having entered the second prism member 20 through traveled the entrance surface 21, reaches the reflecting structure 22, too, becomes smaller. For this reason, unless the angle of incidence θ at which the light enters the entrance surface 21 is large, total reflection conditions that will allow the incident light to be totally reflected at the reflecting structure 22 cannot be achieved. If the total reflection conditions are not present, the light will be transmitted through the reflecting structure 22. Such transmission of light through the reflecting structure 22 may be prevented by forming a metal film through vapor-deposition or the like at the reflecting structure 22 of the second prism member 20 and thus configuring the reflecting structure 22 as a mirror surface. However, even in this situation, total reflection conditions that will allow the light, having been reflected at the reflecting structure 22, to be totally reflected at the entrance surface 21 must be assured.

The minimum vertex angle ϵmin at which light having entered the second prism member 20 with the angle of incidence θ can still be reflected and guided toward the exit surface without being transmitted through the reflecting structure 22 and the entrance surface 21 may be calculated as expressed below. In the expressions below, n represents the refractive index at the second prism member 20.
When light is totally reflected at the reflecting structure surface:

$$\epsilon min = \arcsin(1/n) - \arcsin(\sin \theta/n) \quad (1)$$

When the reflecting structure surface is formed as a mirror surface:

$$\epsilon min = \tfrac{1}{2}\{\arcsin(1/n) - \arcsin(\sin \theta/n)\} \quad (2)$$

Figure 2B:
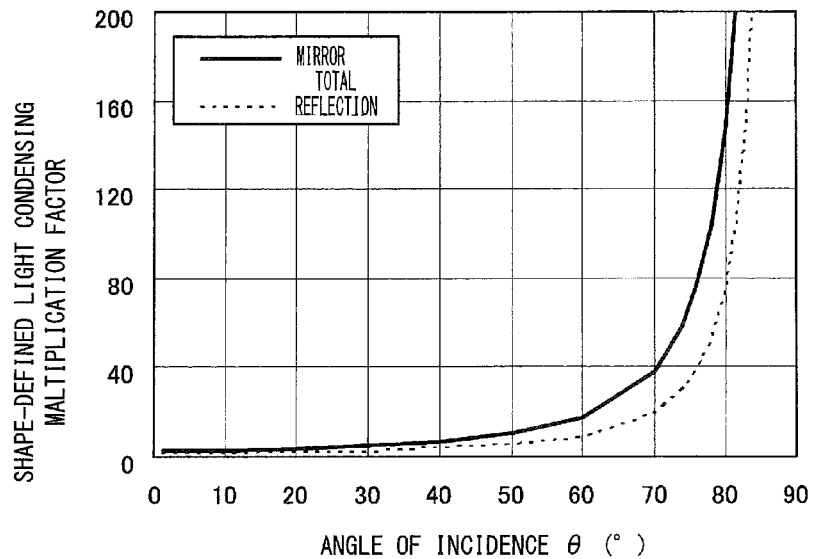

Expressions (1) and (2) above both indicate that when the angle of incidence θ of the light entering the second prism member 20 is larger (closer to 90°), the minimum vertex angle min becomes smaller, making it possible to form a second prism member with a low-profile. FIG. 2B presents graphs each achieved by plotting the relationship between the angle of incidence θ indicated along the horizontal axis, and the shape-defined light condensing multiplication factor indicated along the vertical axis, pertaining to a second prism member with the minimum vertex angle ϵmin. FIG. 2B clearly indicates that the shape-defined light condensing multiplication factor increases sharply when light enters at an angle of incidence θ of approximately 60° at the second prism member having its reflecting structure 22 formed as a mirror surface and that the shape-defined light condensing multiplication factor increases sharply when light enters at an angle of incidence θ of approximately 70° at the second prism member with its reflecting structure 22 formed as a total reflection surface. Accordingly, provided that the optical energy entering the entrance surface 21 remains uniform, light with higher energy density can be condensed toward the photoelectric conversion element 5 if the light enters the second prism member at a larger angle of incidence θ.

Figure 3A:
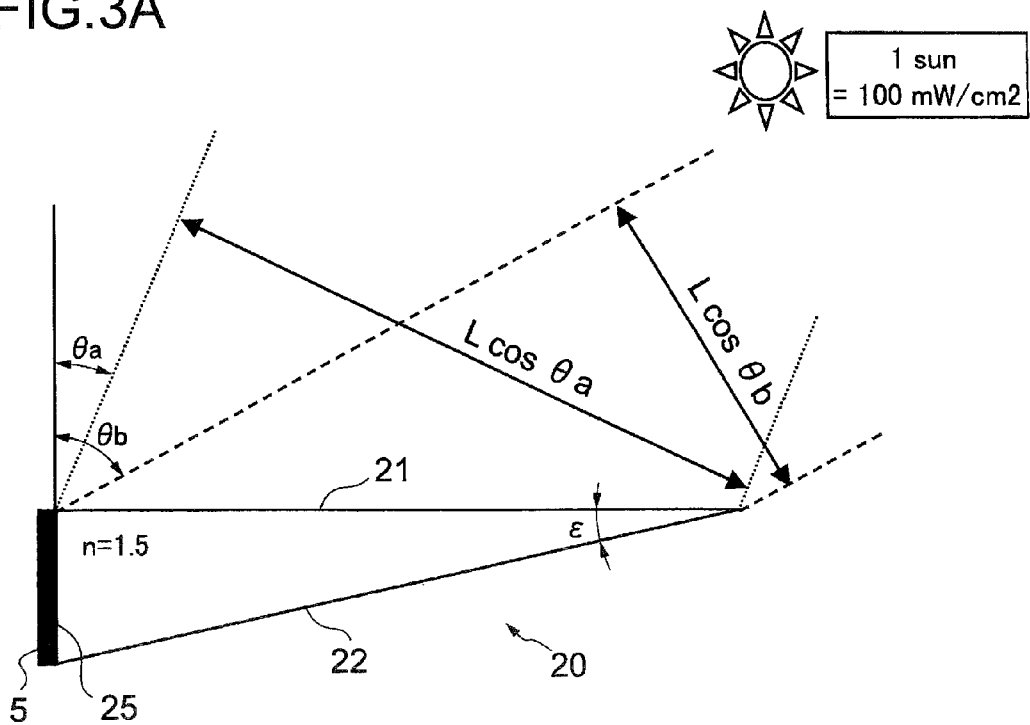
FIG. 3A and FIG. 3B are diagrams in reference to which the relationship between the angle of incidence of solar light and the optical energy entering the entrance surface of the second prism member that may manifest when condensing solar light having entered the second prism member will be described.
Figure 3B:
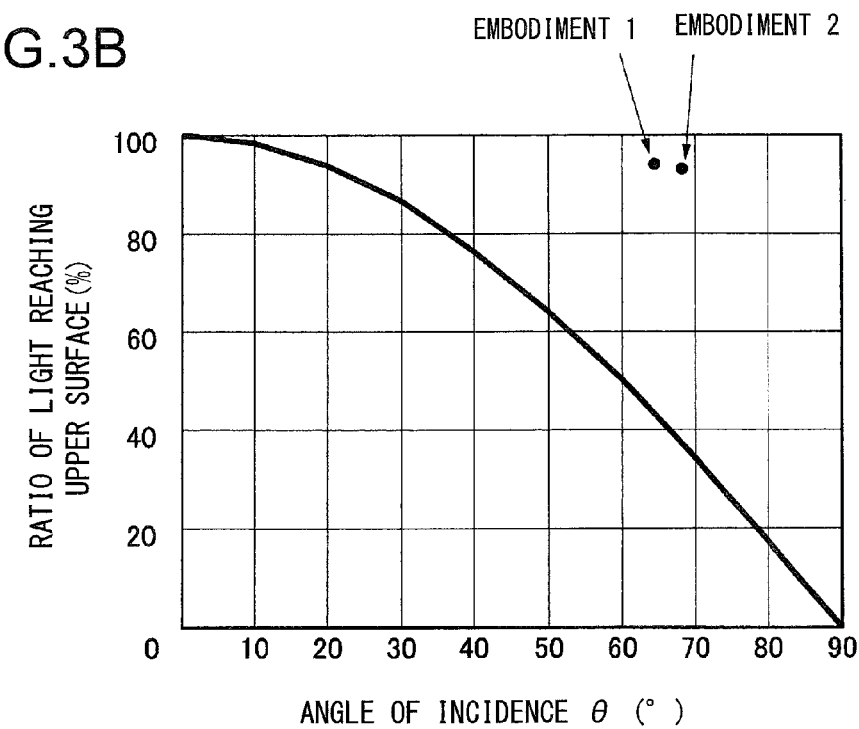

However, when solar light enters the second prism member 20, the quantity of optical energy entering the entrance surface 21 depends on the angle of incidence θ. FIGS. 3A and 3B indicate the relationship between the optical energy entering the entrance surface and the angle of incidence θ. As FIG. 3A indicates, the optical energy entering the entrance surface 21 is in proportion to L cos θa if the angle of incidence of the solar light is θa and is in proportion to L cos θb if the angle of incidence of the solar light is θb. Namely, the optical energy of solar light entering the entrance surface 21 at the angle of incidence θ is in proportion to cos θ. FIG. 3B presents a graph indicating the relationship between the angle of incidence θ and the optical energy entering the entrance surface 21, with the angle of incidence θ of solar light taken along the horizontal axis, and the ratio of the optical energy entering the entrance surface 21 taken along the vertical axis, and the ratio of the optical energy entering the entrance surface 21 when the angle of incidence θ at 0° set at 100%. As FIG. 3B clearly indicates, when the angle of incidence θ is larger (closer to 90°), less optical energy is entering the entrance surface 21. It is to be noted that embodiment 1 and embodiment 2, each represented by a dot in FIG. 3B, will be described in detail later.

While it is obvious from the description provided above that the shape-defined light condensing multiplication factor can be improved by increasing the angle of incidence θ of light entering the second prism member 20, the angle of incidence θ also needs to be minimized in order to increase the shape-defined light condensing multiplication factor. The inventors of the present invention propose a means for satisfying these conflicting requirements, achieved by disposing a first prism member 10 on the side where the entrance surface of the second prism member 20 is located.

The first prism member 10 is an optical element that receives light with a small angle of incidence and outputs the received light with a large exiting angle so as to allow the light to enter the second prism member 20 at a large angle of incidence.

Figure 4:
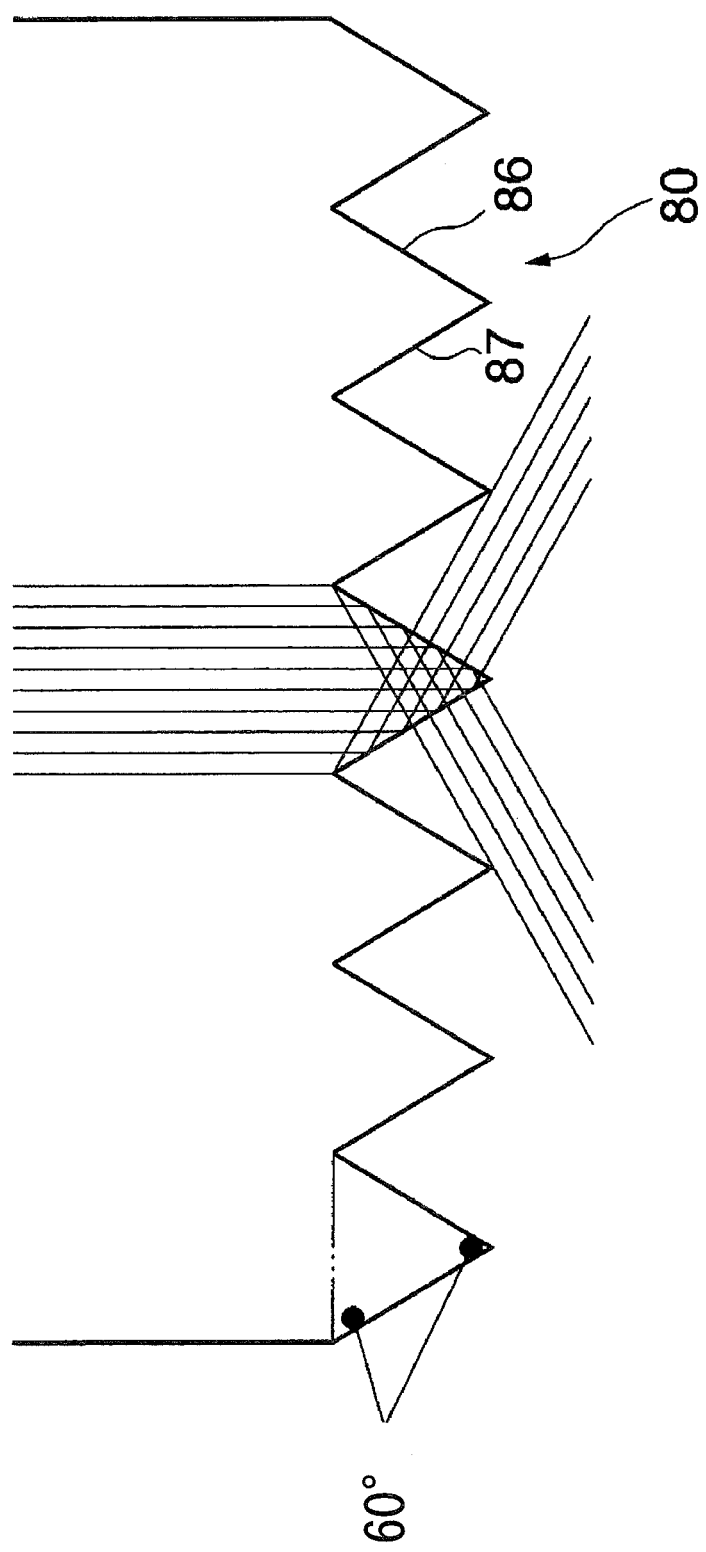
FIG. 4 is an illustration of the basic concept of the first prism member.

Next, in reference to FIG. 4, a light deflection effect achieved by disposing a prism member 80, configured by setting a plurality of triangular prisms side-by-side at the rear surface thereof so as to face opposite the entrance surface 21 of the second prism member, will be described. It is to be noted that the material used to constitute the prism member has a refractive index of approximately 1.5. The angles of two surfaces 86 and 87 of each triangular prism present at the rear surface of the prism member 80 are set so that parallel rays, having entered with the angle of incidence of 0° through the front surface of the prism member 80, each exit along a diagonally downward direction after being totally reflected at the two surfaces 86 and 87. Light that has exited the triangular prism entered the second prism member 20 after becoming deflected toward the light condensing surface 25 of the second prism member 20 will be guided and condensed toward the side where the exit surface 25 is located. However, light that has entered the second prism member 20 after becoming deflected along a direction opposite from the direction toward the light condensing surface 25 of the second prism member 20 will exit through the reflecting structure 22 and the entrance surface 21. In order to ensure that light exits the prism member 80 along a single direction, the light must enter only either of the two surfaces 86 and 87 at each triangular prism. In other words, in order to allow light to enter the second prism member 20 after being deflected toward the light condensing surface 25 of the second prism member 20, it needs to enter, for instance, the flat surface 86 alone.

In reference to FIG. 5, the structure and the functions of the first prism member 10 will be described. The first prism member 10 includes a plurality of light condensing structures 11, 11, . . . formed at a light entrance surface thereof, which are used to condense light having entered therein, and a plurality of deflecting structures 15, 15, . . . each formed in correspondence to one of the light condensing structures and projecting out at a light exit surface thereof, which are used to deflect light having been condensed through the light condensing structures. The deflecting structures 15 each include a first surface 16 at which light, having been condensed at the corresponding light condensing structure 11, is reflected, and a second surface 17 through which light, having been reflected at the first surface 16 with the advancing path thereof thus deflected, is transmitted. The deflecting structures 15 form a sawtooth pattern as the first surface 16 and the second surface 17 are reiterated. Light having entered the first prism member 10 through its entrance surface advances through the light condensing structure 11 and the corresponding deflecting structure 15 so that it is allowed to enter the second prism member 20 through the entrance surface 21 as light deflected by a predetermined angle without being blocked by an adjacent deflecting structure.

The angle of the sun changes as seasons change and time passes. For this reason, a device that condenses solar light entering therein with a single angle of incidence as described above requires a tracking device for tracking the sun. The cost of such a tracking device will vary greatly depending upon the installation accuracy with which the light condensing device 1 is installed and the sun tracking accuracy it assures. Accordingly, in order to achieve a solar light condensing device at low cost, light must be guided to the photoelectric conversion element 5 without greatly lowering the light condensing efficiency even if the angle of incidence of the solar light changes within a certain angular range.

(First Prism Member Adopting a First Structure Mode)

Figure 5:
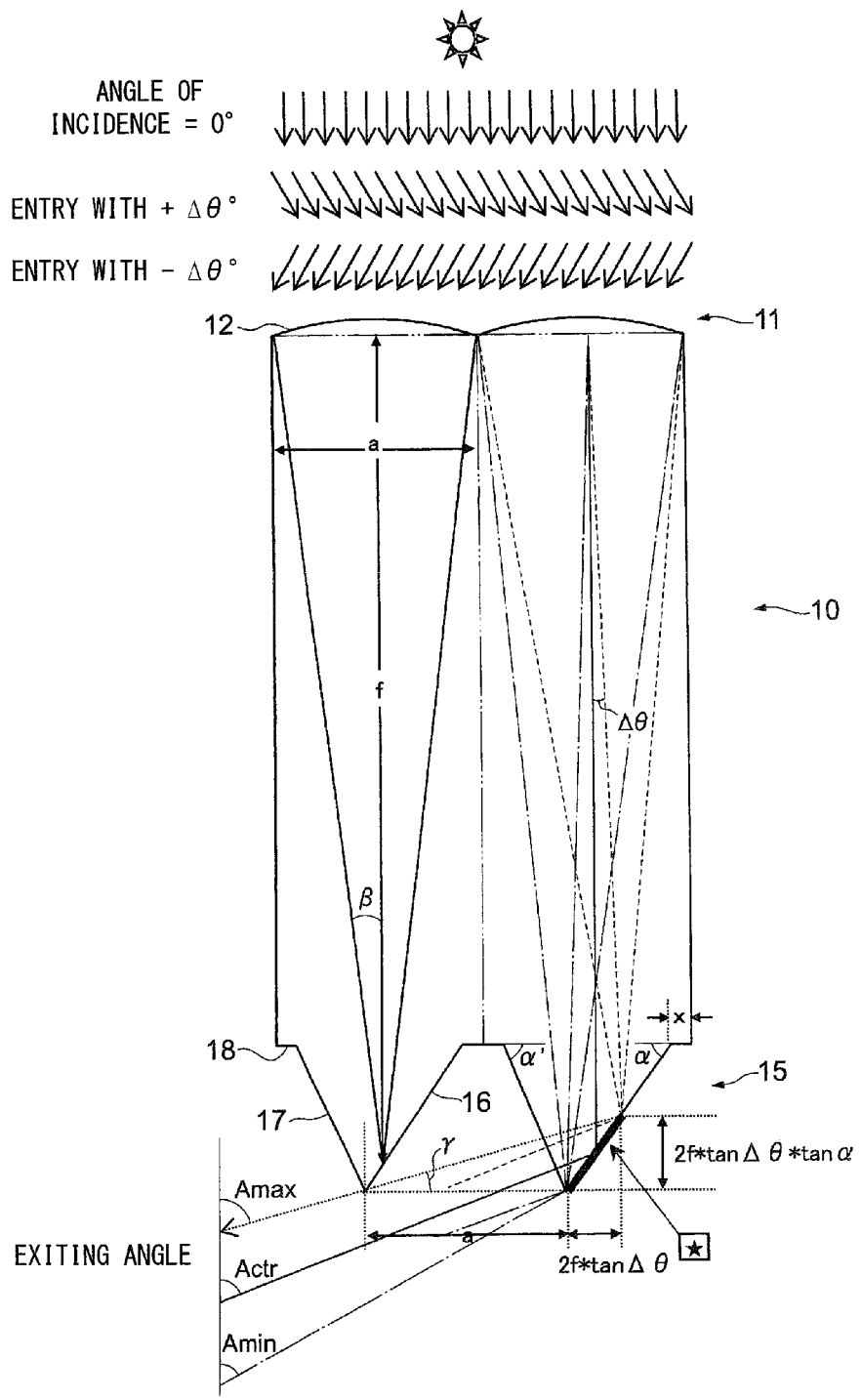
FIG. 5 is an illustration in reference to which the structure and the functions of the first prism member adopting a first structure mode will be described.

FIG. 5 illustrates the structure and the functions of the first prism member 10 adopting the first structure mode in a partial enlargement of FIG. 1. In order to provide a clear, simple explanation, the following description will be given by referring to directions and angles of rays taken within the plane within which the drawing sheet ranges. More specifically, an angle of incidence of 0°, for instance, simply means the angle of 0° within the drawing sheet plane and does not necessarily mean that light enters perpendicular to the entrance surface. FIG. 5 shows two sets of optical cell units, each configured with a light condensing structure 11 and a deflecting structure 15 facing opposite each other. The solid lines at the left-side optical cell unit in FIG. 5 indicate how parallel rays, having entered the light condensing structure 11 of the first prism member 10 with the angle of incidence θ at 0° are condensed. In addition, the dotted lines at the right-side optical cell unit indicate how rays having entered with the angle of incidence θ tilted by +Δθ° relative to θ=0° are condensed and the one-point chain lines at the right side optical cell unit indicate how rays having entered with the angle of incidence θ tilted by −Δθ° relative to θ=0° are condensed, with the bold line marked with a star indicating the area over which light having entered with the angles of incidence falling within the angular range of −Δθ° through +Δθ° reaches the first surface 16.

The light condensing structures 11 at the first prism member 10 adopting this structure mode assume uniform shapes viewed from the direction perpendicular to the drawing sheet surface. Such light condensing structures are formed with a plurality of projecting structures projecting on the light entrance side, such as a plurality of cylindrical lenses 12. The pitch between the optical cell units is set to a [mm], the focal length of the cylindrical lenses 12 is f [mm] and the convergent angle at which the condensed rays converge is β [°]. The deflecting structures 15 are each formed so that all the light having been condensed through the corresponding cylindrical lens 12 is totally reflected at the first surface 16. In addition, the deflecting structures 15 are structured so that light having been transmitted through the second surface 17 at each deflecting structure is allowed to enter the second prism member 20 through the entrance surface 21 without becoming blocked by an adjacent deflecting structure 15.

As indicated in FIG. 5, α represents the angle (referred to as the angle of inclination of the first surface 16) formed by a hypothetical lower surface 18 extending parallel to an upper surface (a plane defined by including ridges of the cylindrical lenses) and the first surface 16 and α' represents the angle (referred to as the angle of inclination of the second surface 17) formed by the lower surface 18 and the second surface 17. The angle of inclination α' of the second surface 17 is set so that the center of the reflected light, resulting from the total reflection taking place at the first surface 16 as light condensed via the cylindrical lens is reflected at the first surface 16, is perpendicular to the second surface 17.

In reference to FIG. 5, the angles formed by the exiting light departing the first prism member 10 and a plane ranging perpendicular to the lower surface 18 will be examined. A central value Actr among the values indicating the exiting angles represents the exiting angle of light having entered the first prism member 10 with an angle of incidence of 0°. A maximum exiting angle Amax is achieved by light having entered the first surface 16 with the smallest angle of incidence among rays of light (indicated by the dotted lines) that have entered the first prism member 10 with a +Δθ° tilt. In addition, a minimum exiting angle Amin is achieved by light having entered the first surface 16 with the largest angle of incidence among rays of light (indicated by the one-point chain lines) that have entered the first prism member 10 with a −Δθ° tilt.

The maximum exiting angle Amax, the exiting angle central value Actr and the minimum exiting angle Amin can be calculated as expressed below, since the convergent angle of rays entering the first surface 16 is; β=arctan (a/2f).

Maximum exiting angle: $A\max=180-2\alpha+\beta+\Delta\theta$ (3)

Central value: $A\text{ctr}=180-2\alpha$ (4)

Minimum exiting angle: $A\min=180-2\alpha-\beta-\Delta\theta$ (5)

A condition expressed below must be satisfied in order to allow all the rays of light having departed each deflecting structure 15 to travel without being blocked by an adjacent deflecting structure 15 (i.e., to pass below the adjacent deflecting structure without entering it). Namely, the following condition must be satisfied with regard to representing the angle formed by a ray of light having departed the deflecting structure 15 and the lower surface 18.

$\tan\gamma > 2f*\tan\Delta\theta*\tan\alpha/(2f*\tan\Delta\theta+a)$ (6)

As has been described earlier, when light enters the second prism member 20 through the entrance surface 21 with a larger angle of incidence (with a greater tilt relative to the entrance surface), the entrance surface 21 and the reflecting structure surface 22 are allowed to form a smaller vertex angle ϵ, and under such circumstances, a greater shape-defined light condensing multiplication factor can be achieved. Namely, when the minimum exiting angle Amin is greater, a smaller vertex angle ϵ is formed at the second prism member 20, and in such a case, the energy density of the light concentrated at the photoelectric conversion element 5 can be increased.

Accordingly, the minimum exiting angle Amin is first set and then the pitch a for the optical cell units, which will affect the thickness of the first prism member 10, is determined. When factors such as machining accuracy are taken into consideration, the pitch a of the optical cell units can be set as little as approximately 200 [μm] and this means that the thickness of the first prism member 10 can be kept down to approximately 1 [mm].

The angle of inclination α of the first surface 16, the convergent angle β of rays at the cylindrical lens 12 and the angle γ formed by a ray of light having exited the deflecting structure 15 and the lower surface 18 at the first prism member 10 may be expressed as below as functions of the angle of inclination Δθ of a ray of light entering the first prism member 10 relative to the angle of incidence of 0° (hereafter simply referred to as an angle of inclination) and the focal length f of the cylindrical lens 12.

$$\alpha = (180 - A\min - \beta - \Delta\theta)/2 \quad (7)$$

$$\beta = \arctan(a/2f) \quad (8)$$

$$\gamma = 2\alpha - 90 - \beta - \Delta\theta \quad (9)$$

A first prism member 10 at which the minimum exiting angle Amin is 54.5° and the optical cell units are disposed with the pitch a set to 3 [mm] will be examined. Assuming that the angle of inclination Δθ of rays of light entering the first prism member 10 is an angle of inclination of the ray that can be tolerated at the light condensing device 1, i.e., an allowable angle, the light condensing device can be provided at lower cost if the allowable angle Δθ is larger. In line with this rationale, a maximum value (maximum allowable angle Δθmax for the allowable angle Δθ, which satisfies the expression (6) is calculated as; maximum allowable angle Δθmax=1.77°. In this situation, the focal length f of the cylindrical lens 12, the angle of inclination α of the first surface 16, the convergent angle β of rays, the angle γ formed by light achieving the maximum exiting angle and the lower surface 18 and the maximum exiting angle Amax are respectively calculated as; f=11.2 [mm], α=58.1°, β=7.63°, γ=16.7° and Amax=73.3°.

Figure 6A:
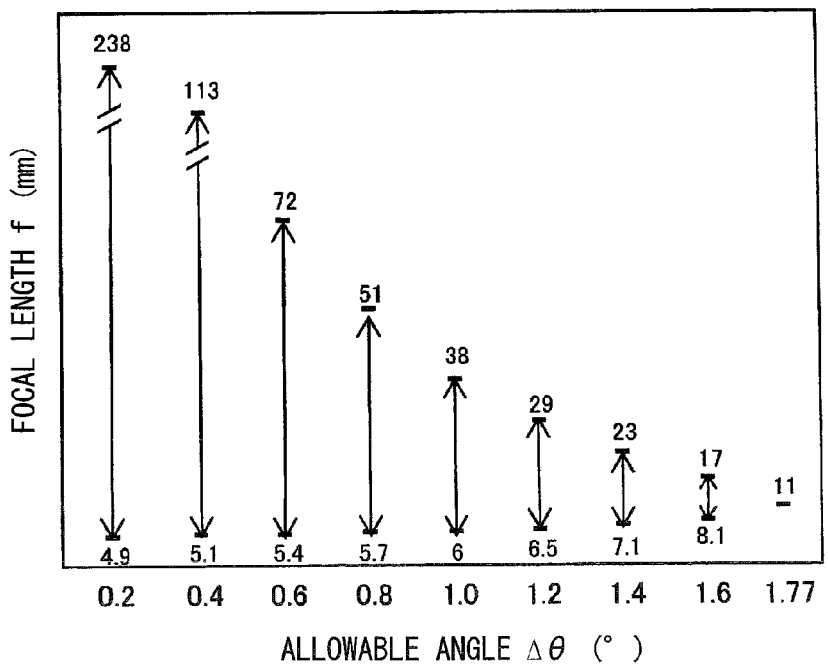
FIG. 6A is a graph indicating the relationship between the allowable angle and the focal length and FIG. 6B is a graph indicating the relationship between the allowable angle and the maximum exiting angle, both manifesting at the first prism member at which the minimum exiting angle adopting the first structure mode is set to 54.5°.
Figure 6B:
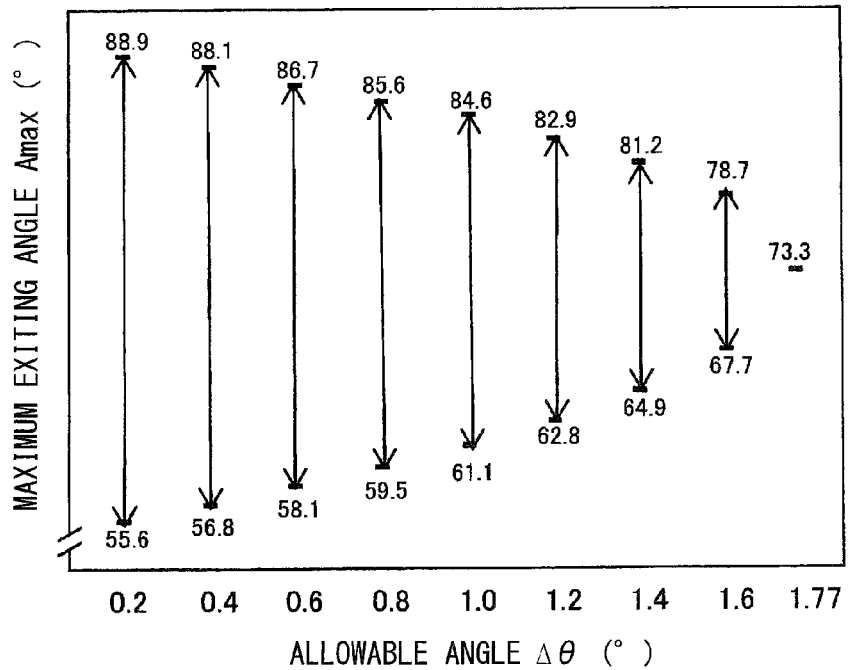

The relationship between the allowable angle Δθ and the focal length f and the relationship between the allowable angle Δθ and the maximum exiting angle Amax, both manifesting at the first prism member 10 at which the minimum exiting angle Amin=54.5° and the pitch a of the optical cell units=3 [mm], are respectively indicated in FIG. 6A and FIG. 6B. As FIG. 6A and FIG. 6B indicate, the allowable angle Δθ may be set over a range, the upper limit of which is 1.77°, at the first prism member 10 designed so as to fulfill the conditions outlined above. For instance, the allowable angle Δθ may be set to 1.4° and in such a case, the focal length f of the cylindrical lens 12 may be set to an optimal value within a range of 7.1 through 23 [mm]. In addition, when the allowable angle Δθ is set at 1.2°, the maximum exiting angle Amax can be set to an optimal value over a range of 62.8 through 82.9°.

Figure 7C:
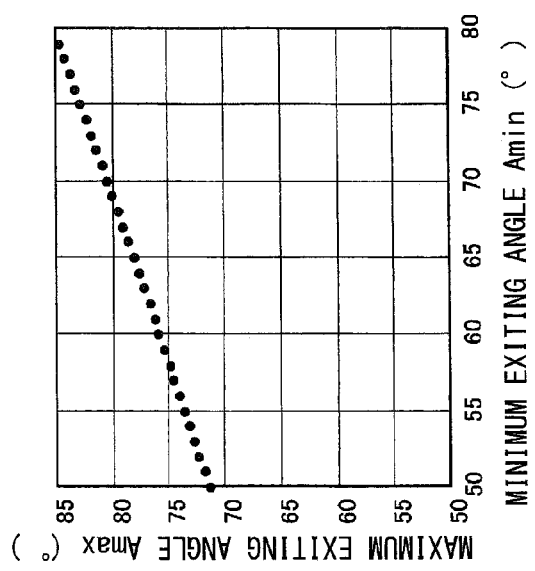
FIG. 7B is a graph indicating the relationship between the minimum exiting angle and the focal length and FIG. 7C is a graph indicating the relationship between the minimum exiting angle and the maximum exiting angle, these manifesting as the minimum exiting angle is altered over a range of 50° through 80° at the first prism member adopting the first structure mode.

Next, findings obtained by varying the minimum exiting angle Amin over a range of 50 through 80° will be described in reference to FIGS. 7A through 7C. FIG. 7A presents a graph obtained through calculation, which indicates the relationship between the minimum exiting angle Amin and the maximum allowable angle Δθmax that will manifest as the minimum exiting angle Amin is altered over the angular range defined above. As FIG. 7A indicates, the maximum allowable angle Δθmax becomes smaller as the minimum exiting angle Amin increases. This means that while the shape-defined light condensing multiplication factor can be raised by increasing the minimum exiting angle Amin, the allowable angular range for the incoming light at a greater minimum exiting angle Amin will become narrower, necessitating higher levels of accuracy in light condensing device installation and sun tracking. By using the graph in FIG. 7A, an optimal angular range over which a desirable balance between the shape-defined light condensing multiplication factor and the sun tracking accuracy is achieved, can be determined.

Figure 7B:
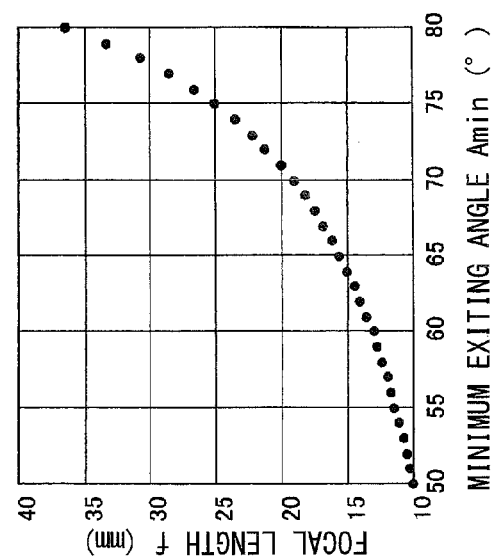
Figure 7A:
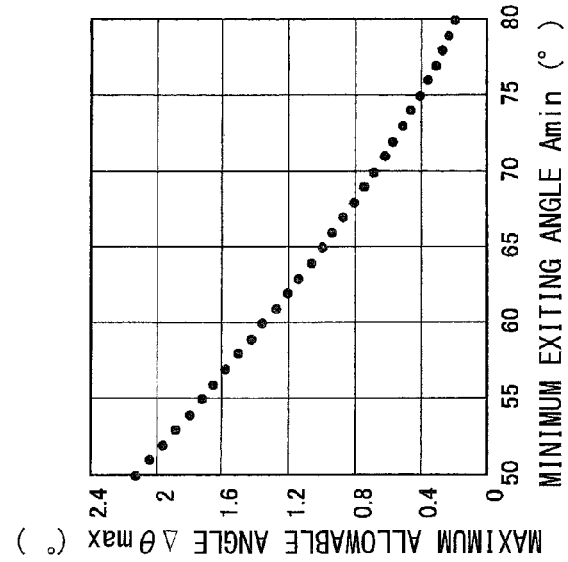
FIG. 7A is a graph indicating the relationship between the minimum exiting angle and the maximum allowable angle.

FIG. 7B presents a graph obtained through calculation that indicates the relationship between the minimum exiting angle Amin and the focal length f at the maximum allowable angle Δθmax to manifest as the minimum exiting angle Amin is altered within the angular range defined above. FIG. 7B clearly indicates that as the minimum exiting angle Amin increases, the focal length f of the cylindrical lens 12 also increases, making it necessary for the first prism member 10 to assume a greater thickness.

FIG. 7C presents a graph obtained through calculation that indicates the relationship between the minimum exiting angle Amin and the maximum exiting angle Amax at the maximum allowable angle Δθmax to manifest as the minimum exiting angle Amin is altered within the angular range defined above. FIG. 7C clearly indicates that as the minimum exiting angle Amin increases, the maximum exiting angle Amax also increases and, at the same time, the angular range of the exiting rays (Amax−Amin) becomes narrower.

As described above, solar light having entered the first prism member 10 with the angle of incidence of 0° is condensed and deflected through the light condensing structures 11 and the deflecting structures 15, exits the first prism member 10 with a large exiting angle A, and enters the second prism member 20 with the large angle of incidence A.

As has been described in reference to FIGS. 1 through 3, the second prism member 20 is configured so as to include the entrance surface 21 through which the light having exited the first prism member 10 enters, the reflecting structure 22, which intersects the entrance surface 21 by forming a vertex angle 8, and guides light, the advancing path of which has been deflected via the first prism member 10, along the deflecting direction, and the exit surface 25 through which light, having been reflected at the reflecting structure 22 and the entrance surface 21 and guided to the left, exits.

The value representing the vertex angle ϵ at the second prism member 20 changes depending upon whether the incoming light, first arriving at the reflecting structure 22 after having entered through the entrance surface 21, is totally reflected at the reflecting structure 22 or the incoming light is reflected at the reflecting structure 22 configured as a mirror surface or the like. The minimum vertex angle min at the second prism member in either of the two different scenarios described above is expressed as a function of the refractive index n of the second prism member and the angle of incidence θ at the entrance surface 21. The minimum vertex angle ϵmin in the structure in which the incoming light is totally reflected at the reflecting structure 22 (will be referred to as a "total reflection type" for simplification) is expressed as in (1), whereas the minimum vertex angle $\epsilon$min in the structure in which the incoming light is reflected at the reflecting structure 22 configured as a mirror surface or the like (will be referred to as a "mirror type" for simplification) is expressed as in (2).

Figure 8:
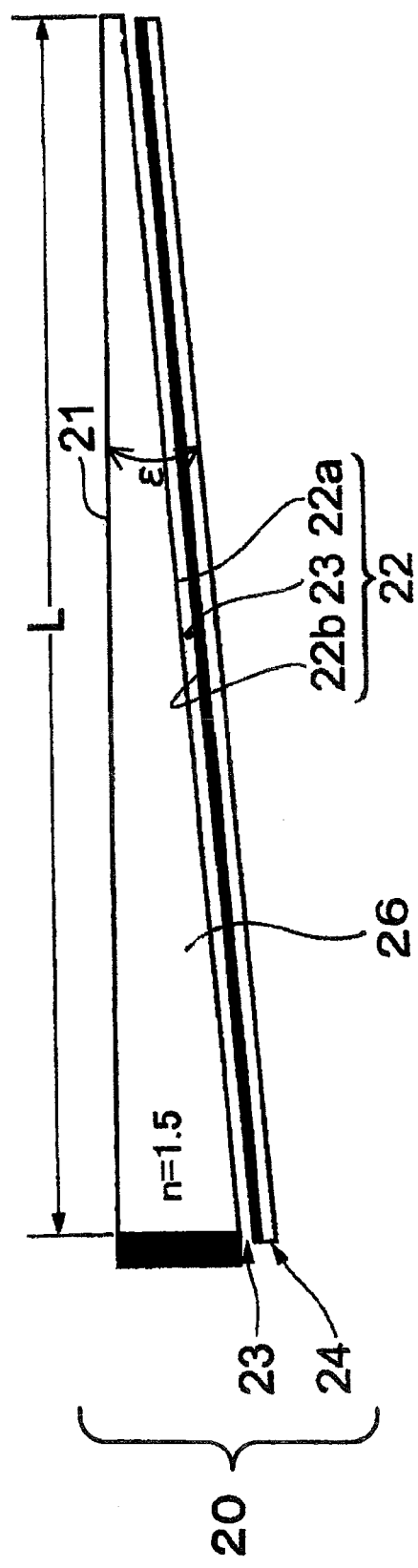
FIG. 8 is a schematic sectional view of the second prism member.

As is obvious through a comparison of expression (1) and expression (2), the minimum vertex angle $\epsilon$min in the mirror type is ½ of the minimum vertex angle $\epsilon$min in the total reflection type. In other words, the shape-defined light condensing multiplication factor can be doubled by configuring the second prism member 20 as a mirror type prism member. However, when the reflecting structure 22 is formed as a mirror surface, loss attributable to light absorption is bound to manifest as light is reflected at the mirror surface. Even a vapor-deposited aluminum film commonly used as a reflecting film assures a reflectance of about 90% and thus, optical energy becomes lost by approximately 10% each time light is reflected. For this reason, the ultimate light condensing efficiency with which the optical energy is condensed at the mirror type second prism member is bound to be low. A second prism member 20, which will be described next, is intended to address this issue. FIG. 8 shows this second prism member 20 in a schematic sectional view.

The second prism member 20 is configured with a prism body 26 and the reflecting structure 22. The reflecting structure 22 is constituted with a flat surface 22a formed at the lower surface of the prism body 26 and a reflecting member 24 disposed so as to face opposite and parallel to the flat surface 22a via an air layer 23, the surface of which facing opposite the flat surface 22a is formed as a mirror surface 22b. The flat surface 22a is formed so as to achieve a high level of flatness through optical polishing. The mirror surface of the reflecting member 24 may be formed by, for instance, vapor-depositing an aluminum film onto the front surface of a glass substrate. The air layer 23 may be formed in any manner as long as it is ensured that it achieves a layer thickness substantially equal to or greater than the wavelength of the condensing target light. The air layer 23 in this particular example is formed by fixing the reflecting member 24 so as to allow the mirror surface 22b to range parallel to the flat surface 22a.

The vertex angle $\epsilon$ at the second prism member 20 is set based upon the minimum vertex angle $\epsilon$min calculated for the mirror type (i.e., calculated as expressed in (2)). In this situation, light having entered the prism body 26 through the entrance surface 21 reaches the reflecting structure 22, is transmitted through the flat surface 22a, exits the prism body 26 and then is reflected at the mirror surface 22b before reentering the prism body 26 through the flat surface 22a. The angle of incidence with which the light reenters the prism body 26 through the flat surface 22a is equal to the angle of incidence of light initially entering the flat surface 22a.

Figure 9:
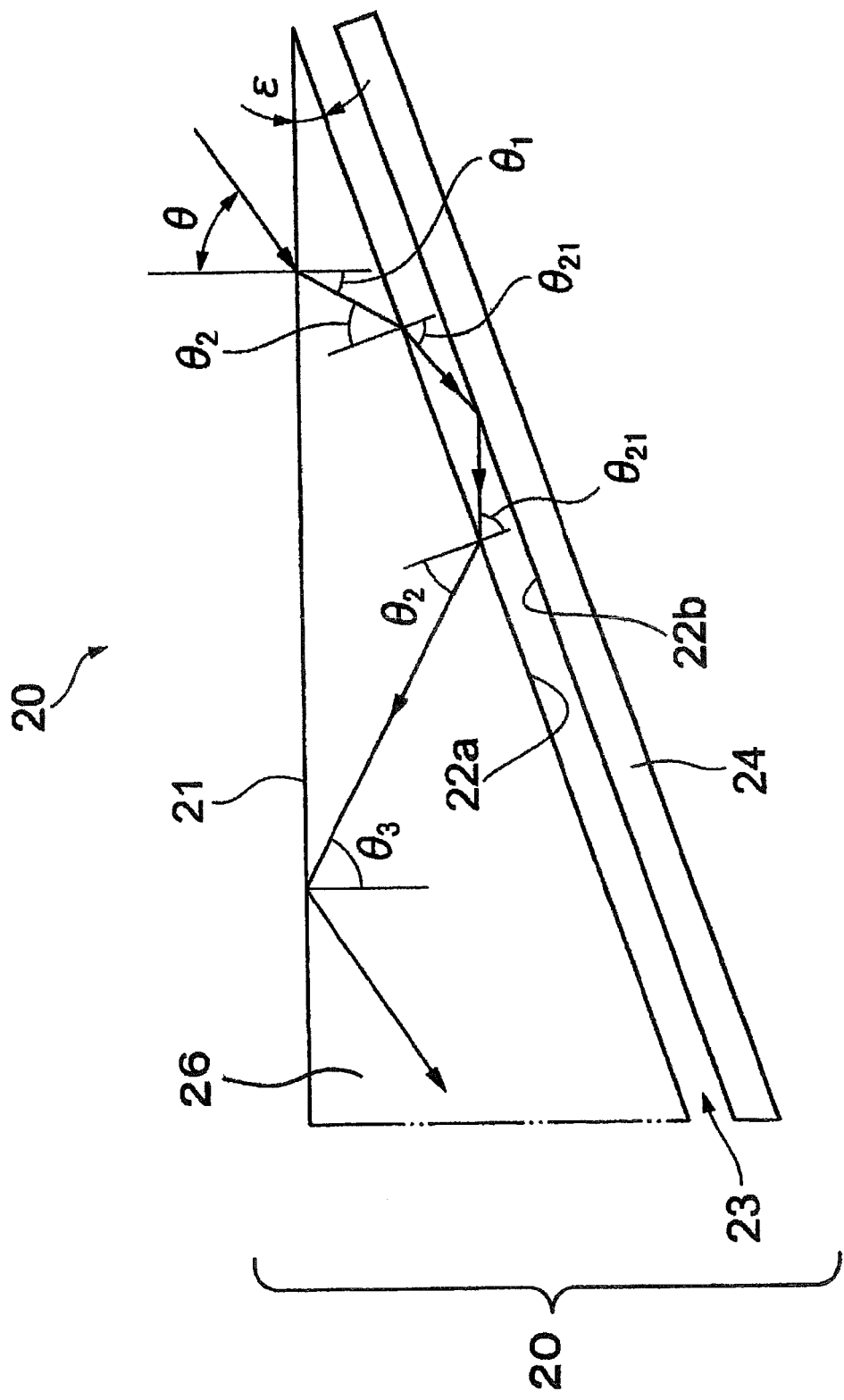
FIG. 9 is an illustration in reference to which the functions of a total reflection+mirror type second prism member will be described.

This passage of light will now be described in reference to FIG. 9. As FIG. 9 shows, the light having entered the prism body 26 through the entrance surface 21 with the angle of incidence $\theta$ is refracted with a refracting angle $\theta 1$ corresponding to the refractive index n of the material constituting the prism body 26 and enters the flat surface 22a with an angle of incidence $\theta 2 = \theta 1 + \epsilon$. The angle of incidence $\theta 2$ is less than the total reflection critical angle. The light having entered the flat surface 22a exits the flat surface 22a with an exiting angle $\theta 21$, is reflected at the mirror surface 22b and reenters the prism body 26 through the flat surface 22a with an angle of incidence $\theta 21$, i.e., a refracting angle $\theta 2$. This refracting angle $\theta 2$ is equal to the angle of incidence $\theta 2$ of the initial light that first reaches the flat surface 22 after entering the prism body 26.

The light having reentered through the flat surface 22a advances through the prism body 26 toward the entrance surface 21 and enters the entrance surface 21 with an angle of incidence $\theta 3$. The angle of incidence $\theta 3$ of the light entering the entrance surface 21 is expressed as; $\theta 3 = \theta 2 + \epsilon = \theta 1 + 2\epsilon$. Since this angle of incidence $\theta 3$ is larger than the total reflection critical angle, the light is totally reflected at the entrance surface 21. As a result, the light travels through the prism body 26 back toward the reflecting structure 22 and enters the flat surface 22a with an angle of incidence $\theta 4$ (not shown). This angle of incidence $\theta 4$, expressed as; $\theta 4 = \theta 3 + \epsilon = \theta 1 + 3\epsilon$, is larger than the total reflection critical angle. The light is thus totally reflected at the flat surface 22a, and advances within the prism body 26 toward the entrance surface 21. Subsequently, each time the light enters the entrance surface 21 or the flat surface 22a, its angle of incidence increases by $\epsilon$. The light having been totally reflected a plurality of times is guided toward the exit surface 25.

By configuring the reflecting structure 22 of the second prism member with the flat surface 22a at the prism body 26 and the mirror surface 22b formed via the air layer 23 as described above, a second prism member 20, assuming a mode whereby light having entered through the entrance surface is reflected at the mirror surface 22b and is subsequently totally reflected inside the prism, is achieved. Such a second prism member 20 will be referred to as a total reflection+mirror type second prism member in this description.

At the total reflection+mirror type second prism member 20, the vertex angle $\epsilon$ at the prism can be set just as small as that at a mirror type second prism member (½ of the vertex angle at a total reflection type second prism member) and thus, a high shape-defined light condensing multiplication factor can be assured. In addition, light is reflected at the mirror surface of the second prism member 20 in this embodiment only once, i.e., only when light having entered through the entrance surface 21 first reaches the reflecting structure 22, and subsequently, the light is invariably totally reflected at the entrance surface 21 and the reflecting structure 22. As a result, the extent of loss is reduced compared to the loss occurring at the mirror type second prism member and the optical energy can be condensed with a high level of condensing efficiency.

In the light condensing device 1, solar light having entered the first prism member 10 with an angle of incidence of 0°, at which the optical energy of the incoming light peaks, is deflected via the light condensing structures 11 and the deflecting structures 15 before it enters the second prism member 20. The second prism member 20, configured as a total reflection+mirror type prism member, condenses the optical energy onto the exit surface 25 with a high level of condensing efficiency. Namely, the light condensing device 1 configured as described above is capable of condensing optical energy of, for instance, solar light with a very high level of efficiency, and thus, assures improved efficiency in optical energy utilization.

As has been described in detail, structural details pertaining to the light condensing structures 11 and the deflecting structures 15 of the first prism member 10 can be set by factoring in the allowable angle $\Delta\theta$ for light entering the first prism member and thus, a light condensing device and a photovoltaic power generation device with compact configurations, which strike an optimal balance between a high solar light condensing multiplication factor and a high level of sun tracking accuracy, can be provided.

Embodiment 1

Simulation was conducted for a light condensing device 1 configured with the first prism member 10 and the second prism member 20 so as to meet the following requirements by using a ray tracing program widely used in the area of optics to trace rays of solar light entering through the upper surface of the first prism member 10. It is to be noted that the simulation was conducted by assuming that the wavelengths of the solar light were within a range of 350 through 1100 [nm], that the apparent diameter of the solar light rays was ±0.26° and that the central optical axes of the solar light rays entering the upper surface of the first prism member 10 with an angle of incidence θ of 0°.

First Prism Member 10
pitch a of the optical cell units×quantity: 3 [mm]×10
focal length f of the cylindrical lenses; 15.3 [mm] (convergent angle β=5.6°)
angle of inclination α of the first surface 16: 56° (offset width x=0.45 [mm])
angle of inclination α' of the second surface 17: 75°
allowable angle Δθ for incoming light: 1.7°
minimum exiting angle Amin: 55°
maximum exiting angle Amax: 73°
Second Prism Member 20 (Total Reflection+Mirror Type)
length L measured along the left/right direction: 30 [mm]
vertex angle ε: 4.05°
reflectance at the mirror surface 22b: 90%

Figure 10B:
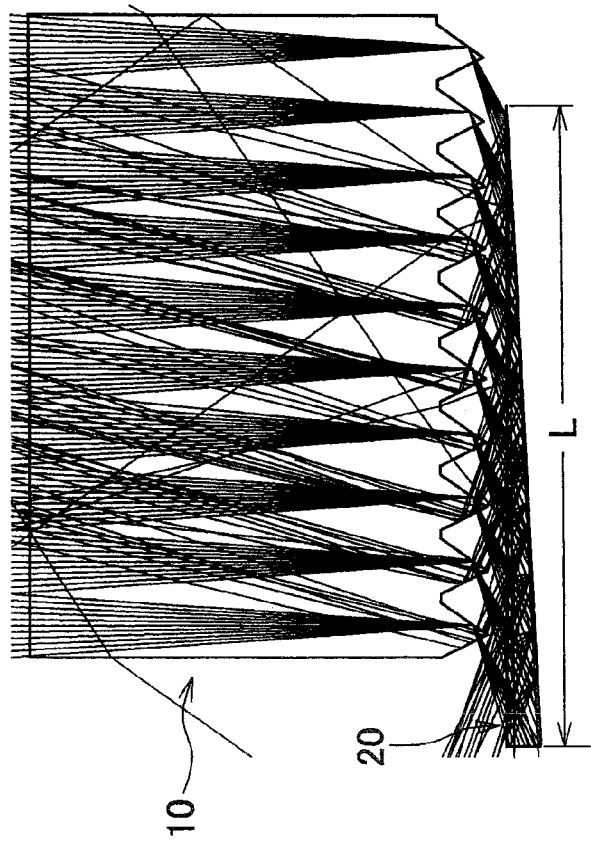
FIG. 10B is a result of a ray tracing simulation conducted by taking into consideration the Fresnel loss at the entrance/exit and the absorption loss at the mirror surface, both for the light condensing device achieved in embodiment 1.
Figure 10A:
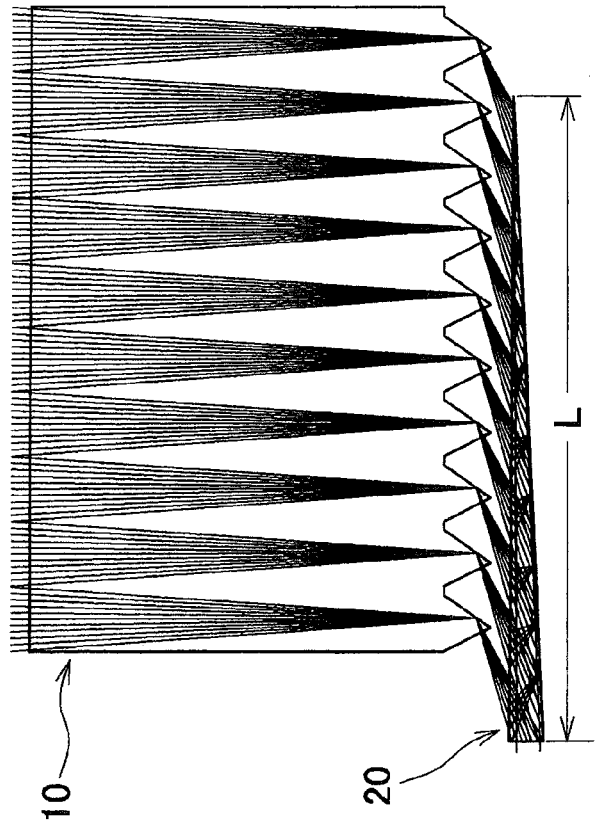
FIG. 10A is a result of a ray tracing simulation conducted by disregarding the Fresnel loss at the entrance/exit and the absorption loss at the mirror surface.

FIG. 10A and FIG. 10B present the results of ray tracing simulation conducted under the conditions listed above. FIG. 10A presents the result of a ray tracing simulation conducted by disregarding the Fresnel loss, which occurs as rays enter and exit each prism member, and the loss attributable to absorption occurring at the mirror surface, whereas FIG. 10B presents the result of a ray tracing simulation conducted by taking into consideration the Fresnel loss occurring as rays enter and exit each prism member and the loss attributable to the absorption occurring at the mirror surface.

The simulation result obtained by disregarding the Fresnel loss occurring at the entrance/exit indicate that all the rays of solar light, having entered the first prism member from above with the angle of incidence of 0°, invariably exit on the lower surface side of the first prism member 10 and enter the second prism member 20. The light enters the second prism member 20 with angles of incidence in a range of 55 through 73° (with an average angle of incidence of 64°). The simulation result obtained by taking into consideration the Fresnel loss at the entrance/exit indicate that 92.8% of the optical energy in the solar light having entered the first prism member 10 with the angle of incidence of 0° exits through the lower surface side of the first prism member 10 and enters the second prism 20.

If there were no first prism member 10 and solar light directly entered the second prism member 20 with an angle of incidence of 64°, the optical energy in the solar light that entered through the entrance surface 21 would only amount to 43.4% of the optical energy available at the entrance surface 21 from perpendicular incident light (see FIG. 3A and FIG. 3B). This means that the presence of the first prism member 10 makes it possible to more than double (increase by a factor of approximately 2.1) the optical energy of solar light entering the second prism member 20.

The light having entered the second prism member 20 with angles of incidence in the 55 through 73° range is condensed as it is reflected at the reflecting structure 22 and the entrance surface 21 before reaching the photoelectric conversion element 5 disposed at the exit surface 25. If the Fresnel loss occurring as the light enters and exits each surface and the loss attributable to absorption at the mirror surface are disregarded, 98% of the optical energy of solar light having entered the first prism member 10 as perpendicular incident light from above will reach the photoelectric conversion element 5. If the Fresnel loss occurring at the entrance/exit and the loss attributable to absorption at the mirror surface are factored in, 74% of the optical energy in the solar light having entered the first prism member 10 as perpendicular incident light will reach the photoelectric conversion element 5.

An energy condensing multiplication factor defined as; energy condensing multiplication factor=energy density of existing light [W/cm$^2$]÷energy density of incoming light [W/cm$^2$], will be calculated for the light condensing device 1 in the embodiment as; shape-defined light condensing multiplication factor 14.1×74%=10.4. The energy condensing multiplication factor calculated for a device in which solar light directly enters the second prism member 20 instead of first entering a first prism member 10 is 5.0 when the angle of incidence is 66°, at which the shape-defined light condensing multiplication factor is at its highest.

The light condensing device 1 achieved in the embodiment described above is capable of condensing the optical energy in solar light with a high level of efficiency while assuming a compact device configuration that includes a second prism member with a small vertex angle comparable to that in a mirror type second prism member.

Embodiment 2

Next, simulation results obtained by having solar light enter through the upper surface of the first prism member 10 in a light condensing device that includes the first prism member 10 and the second prism member 20 meeting the following requirements will be described.

First Prism Member 10
pitch a of the optical cell units×quantity: 3 [mm]×10
focal length f of the cylindrical lenses; 21.5 [mm] (convergent angle β=4°)
angle of inclination α of the first surface 16: 56.5° (offset width x=0.37.5 [mm])
angle of inclination α' of the second surface 17: 65°
allowable angle Δθ for incoming light: 1°
minimum exiting angle Amin: 62°
maximum exiting angle Amax: 76°
Second Prism Member 20 (Total Reflection+Mirror Type)
length L measured along the left/right direction: 30 [mm]
vertex angle ε: 4.05°
reflectance at the mirror surface 22b: 90%

Figure 11A:
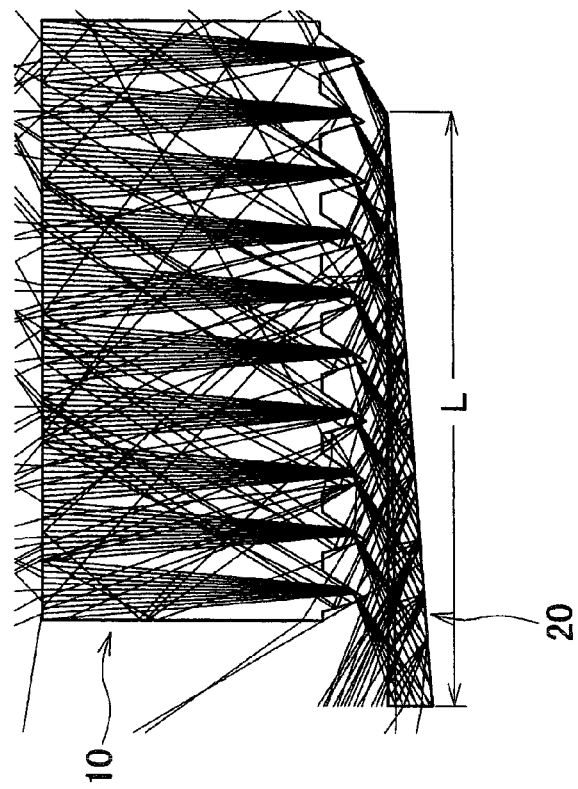
FIG. 11A is a result of a ray tracing simulation conducted by disregarding the Fresnel loss at the entrance/exit and the absorption loss at the mirror surface.
Figure 11B:
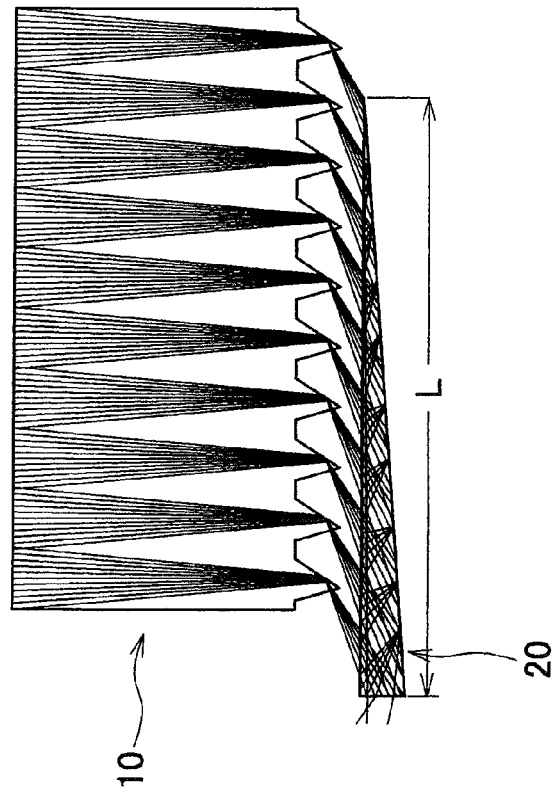
FIG. 11B is the result of a ray tracing simulation conducted by taking into consideration the Fresnel loss at the entrance/exit and the absorption loss at the mirror surface, both for the light condensing device achieved in embodiment 2.

FIG. 11A and FIG. 11B present the results of ray tracing simulation conducted under the conditions listed above. FIG. 11A presents the result of a ray tracing simulation conducted by disregarding the Fresnel loss, which occurs as rays enter and exit each prism member, and the loss attributable to absorption occurring at the mirror surface, whereas FIG. 11B presents the result of a ray tracing simulation conducted by taking into consideration the Fresnel loss occurring as rays enter and exit each prism member and the loss attributable to the absorption occurring at the mirror surface.

The simulation result obtained by disregarding the Fresnel loss occurring at the entrance/exit indicate that all the rays of solar light, having entered the first prism member as perpendicular incident light, invariably exit on the lower surface side of the first prism member 10 and enter the second prism member 20. The light enters the second prism member 20 with angles of incidence in a range of 62 through 76° (with an average angle of incidence of 68°). The simulation result obtained by taking into consideration the Fresnel loss at the entrance/exit indicate that 92.4% of the optical energy in the solar light having entered the first prism member 10 as perpendicular incident light exits through the lower surface side of the first prism member 10 and enters the second prism 20.

If there were no first prism member 10 and solar light directly entered the second prism member 20 with an angle of incidence of 68°, the optical energy in the solar light entering through the entrance surface 21 would only amount to 37.5% of the optical energy entering the entrance surface 21 from perpendicular incident light (see FIG. 3A and FIG. 3B). This means that the presence of the first prism member 10 makes it possible to more than double (increase by a factor of approximately 2.5) the optical energy of solar light entering the second prism member 20 in this embodiment, as well.

The light having entered the second prism member 20 with angles of incidence in the 62 through 76° range is condensed as it is reflected at the reflecting structure 22 and the entrance surface 21 before reaching the photoelectric conversion element 5 disposed at the exit surface 25. If the Fresnel loss occurring as the light enters and exits each surface and the loss attributable to absorption at the mirror surface are disregarded, 99% of the optical energy of solar light having entered the prism member 10 with the angle of incidence of 0° will reach the photoelectric conversion element 5. If the Fresnel loss occurring at the entrance/exit and the loss attributable to absorption at the mirror surface are factored in, 72% of the optical energy in the solar light having entered the first prism member 10 as perpendicular incident light will reach the photoelectric conversion element 5. Accordingly, the energy condensing multiplication factor for the entire light condensing device is calculated to be; shape-defined light condensing multiplication factor 14.1×70%=10.2. The energy condensing multiplication factor calculated for a device in which solar light directly enters the second prism member 20 instead of first entering a first prism member 10 is 5.0 when the angle of incidence is 66°, at which the shape-defined light condensing multiplication factor is at its highest.

The light condensing device 1 achieved in this embodiment, too, is capable of condensing the optical energy in solar light with a high level of efficiency while assuming a compact device configuration that includes a second prism member with a small vertex angle comparable to that in a mirror type second prism member.

Figure 12A:
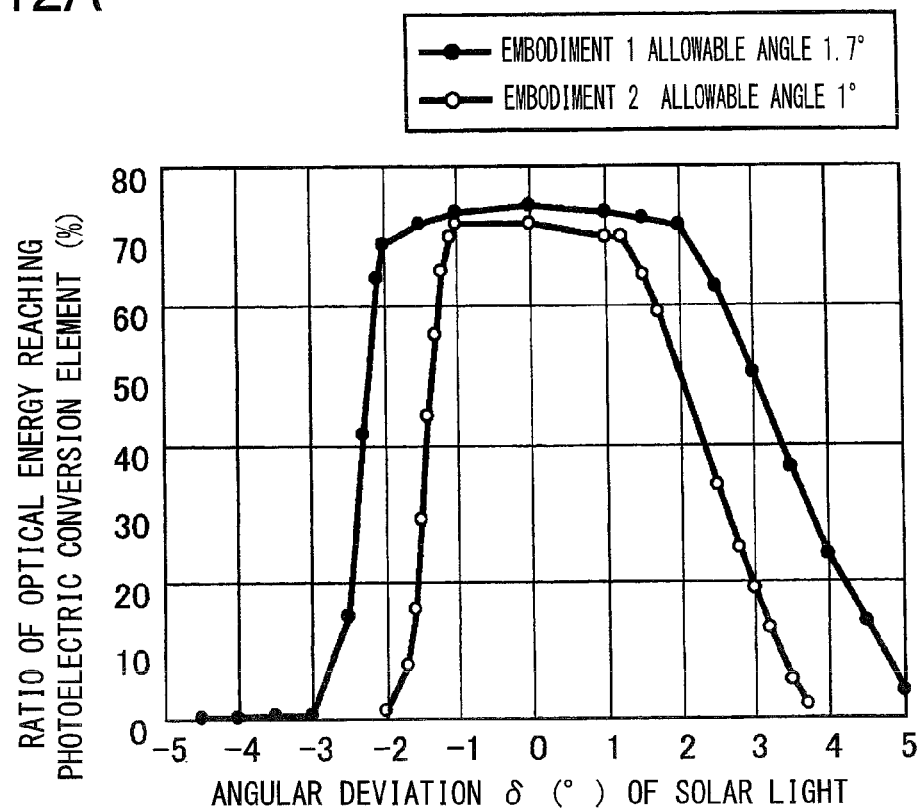
FIG. 12A is a graph presenting a simulation result indicating relationship between the angular deviation in the angle of incidence of solar light and the arrival ratio of the optical energy reaching the photoelectric conversion element when the direction of the incoming solar light shifts along the direction in which the optical cell units at the respective first prism members are arrayed in the reiterative pattern and FIG. 12B is a graph indicating simulated relationship between the angular deviation in the angle of incidence of solar light and the arrival ratio of the optical energy reaching the photoelectric conversion element when the direction of the incoming solar light shifts within a plane ranging perpendicular to the direction in which the optical cell units in the respective first prism member are arrayed in the reiterative pattern, both for the light condensing devices achieved in embodiment 1 and embodiment 2.
Figure 12B:
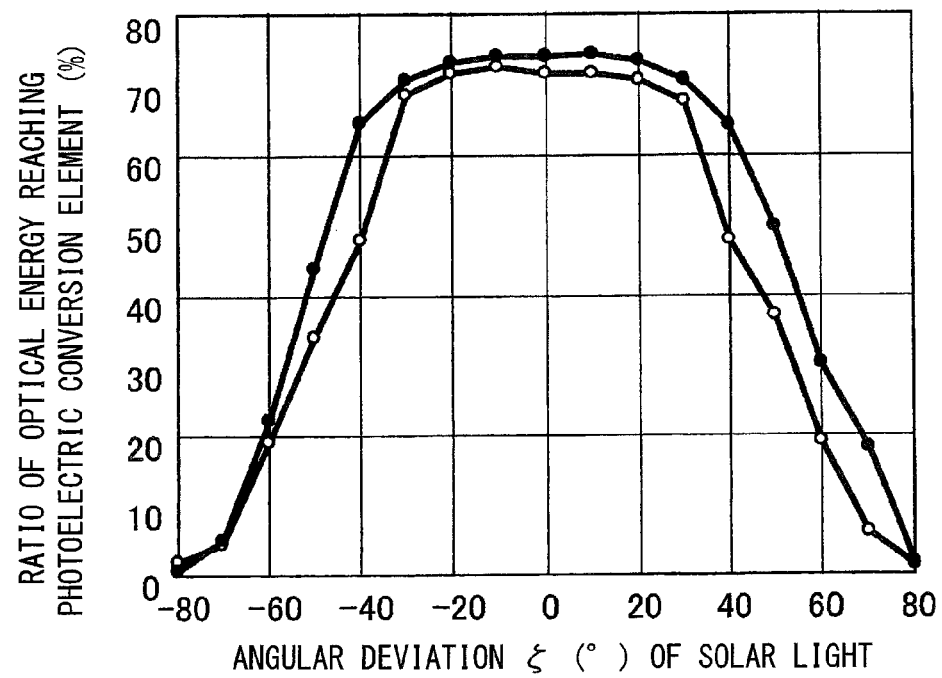

Next, in reference to FIG. 12A and FIG. 12B, simulation results indicating the effects of deviation in the angle of incidence of solar light entering the first prism member 10 through its upper surface as perpendicular incident light in the light condensing device 1 will be described. The graph in FIG. 12A provides a simulation result indicating optical energy arrival rates and show how the ratio of optical energy reaching the photoelectric conversion element 5 changes if the entrance direction of the solar light entering the first prism member 10 shifts to the left/right within a range of ±δ° relative to the perpendicular entrance within the drawing sheet on which each figure among FIGS. 1 through 5 is presented (i.e., if the light entrance direction deviates relative to the perpendicular entrance, within the range of ±δ° within the plane perpendicular to the direction in which the optical cell units in the first prism member are reiteratively arrayed). The solar light shift direction is indicated with the signs (+, −) assigned in line with the sign assignment in FIG. 5. The graph in FIG. 12B provides a simulation result indicating optical energy arrival rates and show how the ratio of optical energy reaching the photoelectric conversion element 5 changes if the entrance direction of the solar light entering the first prism member 10 shifts to the front/rear within a range of ±ζ° relative to the perpendicular entrance within a plane ranging perpendicular to the drawing sheet on which each figure among FIGS. 1 through 5 is presented (i.e., if the light entrance direction deviates relative to the vertical entrance, within the range of ±ζ° within the plane perpendicular to the direction in which the optical cell units in the first prism member are reiteratively arrayed). FIG. 12A and FIG. 12B both indicate arrival rates relative to the optical energy of solar light entering the first prism member 10 through its upper surface set at 100%, which were calculated through simulation conducted by taking into consideration the Fresnel loss occurring at the entrance/exit surfaces and the loss attributable to absorption occurring at the mirror surface.

FIG. 12A indicates that as long as the angular deviation δ of the angle of incidence of the solar light stays within the range defined by the allowable angle Δθ=1.7° for the light condensing device in embodiment 1 and the allowable angle Δθ=1.7° for the light condensing device in embodiment 2, no significant change occurs in the optical energy reaching the photoelectric conversion element 5, and thus, high efficiency is assured. When the angular deviation δ of the angle of incidence of the solar light exceeds the range defined by the allowable angle Δθ, the rates of optical energy reaching the photoelectric conversion element 5 become lower in both the light condensing device in embodiment 1 and the light condensing device in embodiment 2. However, when the angular deviation δ manifests along the negative direction, i.e., when the direction of the solar light shifts toward the exit surface of the second prism member 20, the rates drop drastically, whereas when the angular deviation δ manifests along the positive direction, i.e., when the direction of the solar light shifts toward the vertex of the second prism member 20, the rates decrease relatively gently.

The simulation results in FIG. 12B, on the other hand, indicate that the rates of optical energy reaching the photoelectric conversion element 5 do not change significantly as long as the angular deviation ζ remains within a range of approximately ±30°, which means that high efficiency is assured in a stable manner. Namely, even if the entrance direction of the solar light shifts to a fairly significant extent relative to the perpendicular entrance within the plane ranging perpendicular to the direction in which the optical cell units are arrayed in the reiterative pattern at the first prism member, the shift does not greatly affect the rates of optical energy reaching the photoelectric conversion element 5.

As described above, it has been verified that the light condensing device 1 is capable of condensing optical energy in solar light with high efficiency within the range defined by the allowable angle Δθ having been set. In addition, the first prism member in the light condensing device 1 adopts a structure achieved by arraying a plurality of optical cell units, made up with light condensing structures and deflecting structures with uniform sectional shapes viewed along a given direction, in a reiterative pattern, and fairly significant installation angular error and tracking angular error can be tolerated within the plane ranging perpendicular to the direction in which the plurality of optical cell units are reiteratively arrayed.

(Variation)

In the description provided above, light having entered the first prism member 10 with an angle of incidence of −Δθ° and condensed at each cylindrical lens 12 is then condensed near the lower end of the first surface 16 (the vertex of the deflecting structure 15) (see FIG. 5). However, light may be condensed at the first surface 16 at a position other than that taken in this example. FIG. 13A and FIG. 13B present an example of a variation in which light is condensed at a different position at the first surface 16. FIG. 13A shows the advancing path of light having entered the first prism member 10 with an angle of incidence of +Δθ, whereas FIG. 13B shows the advancing path of light having entered the first prism member 10 with an angle of incidence of −Δθ. In the variation shown in the figure, light having entered the first prism member 10 with the angle of incidence of −Δθ° matching the allowable angle, is condensed at the first surface 16 at a position slightly above the lower end of the first surface 16.

While an explanation has been given by assuming that the second prism member 20 is configured as a total reflection+ mirror type prism member, the present invention may be adopted in a light condensing device that includes a second prism member 20 configured as a total reflection type prism member or a mirror type prism member.

(First Prism Members Adopting a Second Structure Mode)

Figure 14:
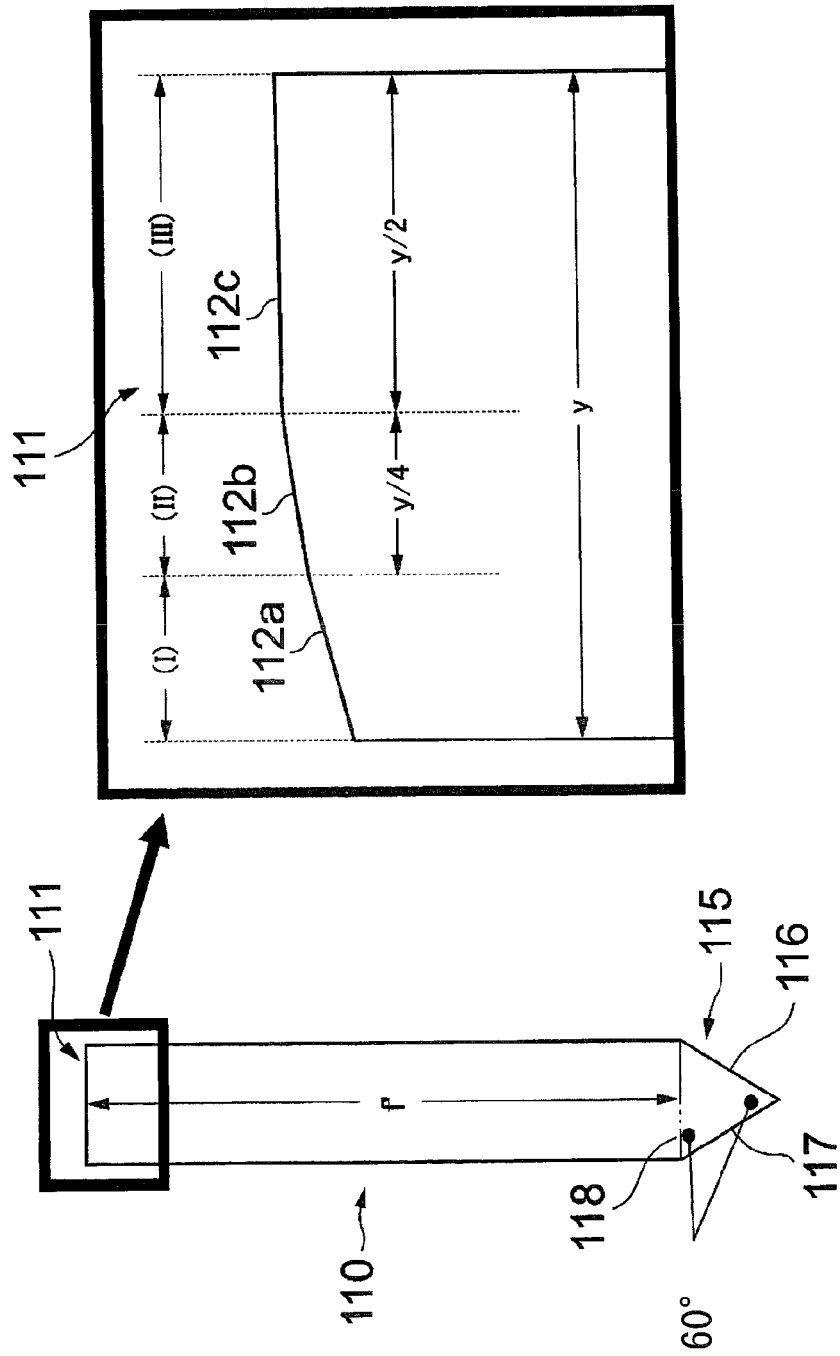
FIG. 14 is an illustration in reference to which the structures of the light condensing structures and the deflecting structures of the first prism member achieved as a first structural example adopting a second structure mode will be described.

Next, a first prism member adopting the second structure mode will be described in reference to FIG. 14. FIG. 14 provides an illustration in reference to which the structure and the functions of a first prism member 110 adopting the second structure mode, achieved as a first structural example, will be explained and an enlarged view of part of the first prism member 110. FIG. 14 shows an optical cell unit made up with a pair of structural members, i.e., a light condensing structure 111 and a deflecting structure 115, in the first prism member 110.

The primary structural elements configuring the first prism member 110 are a plurality of light condensing structures 111, 111, . . . that condense light having entered therein and a plurality of deflecting structures 115, 115, . . . each corresponding to one of the light condensing structures and projecting out at the rear surface.

The light condensing structures 111 each achieve a protruding structure, formed with a plurality of flat surfaces ranging along the direction perpendicular to the drawing sheet on which FIG. 14 is presented, on the light entrance side. To describe this in further detail, each light condensing structure 111 is formed with three surfaces, an A surface 112*a*, a B surface 112*b* adjacent to the A surface 112*a* and a C surface 112*c* adjacent to the B surface 112*b*, as indicated in the partial enlargement in FIG. 14. The upper surface of the first prism member 110 is formed with the plurality of light condensing structures 111, each constituted with the three surfaces, arrayed reiteratively along the left/right direction running toward the left edge and the right edge of the drawing sheet.

The C surface 112*c*, ranging perpendicular to the light entrance direction, is formed within an approximate range of y/2, with y representing the width of the optical cell unit measured along the left/right direction in the figure. The B surface 112*b*, which is a flat surface assuming a predetermined angle of inclination relative to the C surface, is formed within an approximate range of y/4 so as to connect with the C surface 112*c*. The A surface 112*a*, which is a flat surface achieving an angle of inclination relative to the C surface greater than that of the B surface 112*b*, is formed within an approximate range of y/4 so as to connect with the C surface 112*c*.

The deflecting structures 115 each include a first surface 116 at which light having been condensed via the corresponding light condensing structure 111 is reflected and a second surface 117 through which the light with the advancing path thereof deflected after being reflected at the first service 116 is transmitted. A sawtooth formation is achieved with the first surface 116 and the second surface 117 set in a reiterative pattern. The deflecting structures 115 are formed as triangular prisms with uniform shapes viewed along the direction running perpendicular to the drawing sheet, with the section of the area defined by the first surface 116, the second surface 117 and a hypothetical lower surface 118 ranging parallel to the upper surface (i.e., the C surface 112*c*) taking on the shape of an equilateral triangle. Namely, the angle of inclination α of the first surface, formed by the lower surface 118 and the first surface 116, is equal to 60° and the angle of inclination α' of the second surface, formed by the lower surface 118 and the second surface 117, is equal to 60°.

In addition, the distance f' between the upper surface 112*c* and the lower surface 118 and the angles of inclination of the A surface 112*a* and the B surface 112*b* at each light condensing structure 111 in the first prism member 110 are set so that all the light condensed via the light condensing structure 111 is totally reflected at the first surface 116. Furthermore, the first prism member 110 is configured so that light having been transmitted through the second surface 117 is allowed to enter the second prism member through its entrance surface 21 without being blocked by an adjacent deflecting structure 115.

Figures 15A, 15B, 15C:
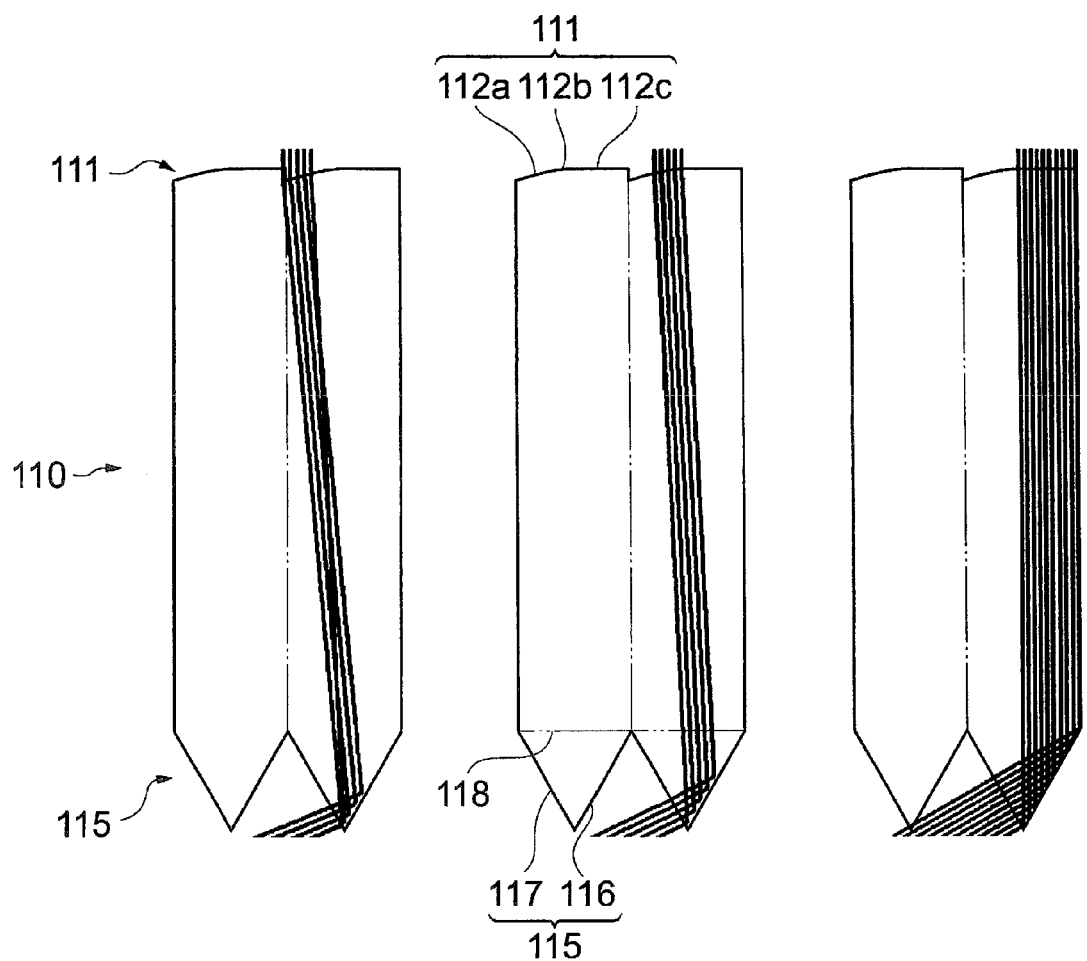
FIG. 15A, FIG. 15B and FIG. 15C are illustrations in reference to which the functions of the light condensing structures and the deflecting structures of the first prism member achieved as the first structural example adopting the second structure mode will be described.

FIGS. 15A through 15C illustrate how light having entered the first prism member 110 shown in FIG. 14 through its upper surface with an angle of incidence of 0° (to the C surface 112*c*) advances. FIG. 15A illustrates the advancing path of rays having entered through the A surface 112*a*, FIG. 15B illustrates the advancing path of rays having entered through the B surface 112*b* and FIG. 15C illustrates the advancing path of rays having entered through the C surface 112*c*.

As shown in FIG. 15A, the light enters the first prism member 110 through the A surface 112*a* is refracted at the A surface 112*a* and thus advances through the first prism member 110 diagonally downward to the right. The angle of inclination of the A surface 112*a* is set so that light having entered at the left end of the A surface 112*a* reaches the lower end of the first surface 116. Light having entered at the right end of the A surface 112*a*, on the other hand, reaches the first surface 116 over an intermediate area thereof along the top/bottom direction. Likewise, the B surface 112*b* is formed so that light having entered at the left end of the B surface reaches the lower end of the first surface 116 and that light having entered at the right end of the B surface reaches the first surface 116 over an intermediate area thereof along the top/bottom direction. Light having entered the first prism member 110 through the C surface 112*c* advances through the first prism member 110 without becoming refracted. The C surface 112*c* is formed so that light having entered at its left end reaches a point near the lower end of the first surface 116 and that light having entered at the right end of the C surface reaches a point near the upper end of the first surface 116.

Light having entered through the A surface 112*a*, the B surface 112*b* and the C surface 112*c*, advanced through the first prism member 110 and reached the first surface 116. The light is then totally reflected at the first surface 116, is transmitted through the second surface 117 and exits the first prism member 110. The first prism member 110 is configured so that the light is never blocked by an adjacent deflecting structure 115. The light having exited the first prism member then enters the second prism member 20, disposed on the exit side of the first prism member, through the entrance surface 21.

The basic structure of the second prism member 20 has already been described. Namely, the second prism member 20 is configured so as to include the entrance surface 21 through which the light having exited the first prism member 110 enters, the reflecting structure 22, which intersects the entrance surface 21 by forming a vertex angle £, and reflects light, the advancing path of which has been deflected via the first prism member 110, and the exit surface 25 through which light having been reflected at and guided via the reflecting structure 22 and the entrance surface 21 exits (see FIG. 8 and the like). The second prism member in a light condensing device 2, which includes the first prism member 110 adopting this structure mode, is the total reflection+mirror type second prism member having been described earlier (see FIG. 9).

In the light condensing device 2 structured as described above, solar light having entered the first prism member 110 with an angle of incidence of 0°, at which the optical energy of the incoming light is at a maximum, is deflected by the light condensing structures 11 and the deflecting structures 15 before it enters the second prism member 20. The second prism member 20, configured as a total reflection+mirror type prism member, condenses the optical energy onto the exit surface 25 with a high level of condensing efficiency. Namely, the light condensing device 2 configured as described above is capable of condensing optical energy of, for instance, solar light with a very high level of efficiency, and thus, assures improved efficiency in optical energy utilization.

Embodiment 3

Simulation was conducted for a light condensing device 2 configured with the first prism member 110 and the second prism member 20 formed so as to meet the following requirements by using a ray tracing program widely used in the area of optics to trace rays of solar light entering through the upper surface of the first prism member 110. The wavelengths and the apparent diameter of the solar light are the same as those having been described earlier, and the simulation was conducted by assuming that the central optical axes of the solar light rays entered the upper surface of the first prism member 110 at an angle of incidence θ of 0°.

First Prism Member 110
  pitch a of the optical cell units×quantity: 2 [mm]×15
  distance f' between the upper surface and the lower surface: 10 [mm]
  width and angle of inclination of the A surface 112a: 0.5 [mm], 15°
  width and angle of inclination of the B surface 112b: 0.5 [mm], 8°
  width and angle of inclination of the C surface 112c: 1 [mm], 0°
    angle of inclination α of the first surface 116: 60°
    angle of inclination α' of the second surface 117: 60°
    Second Prism Member 20 (Total Reflection+Mirror Type)
    length L measured along the left/right direction: 30 [mm]
    vertex angle ε: 3.3°
    reflectance at the mirror surface 22b: 90%

Figure 16A:
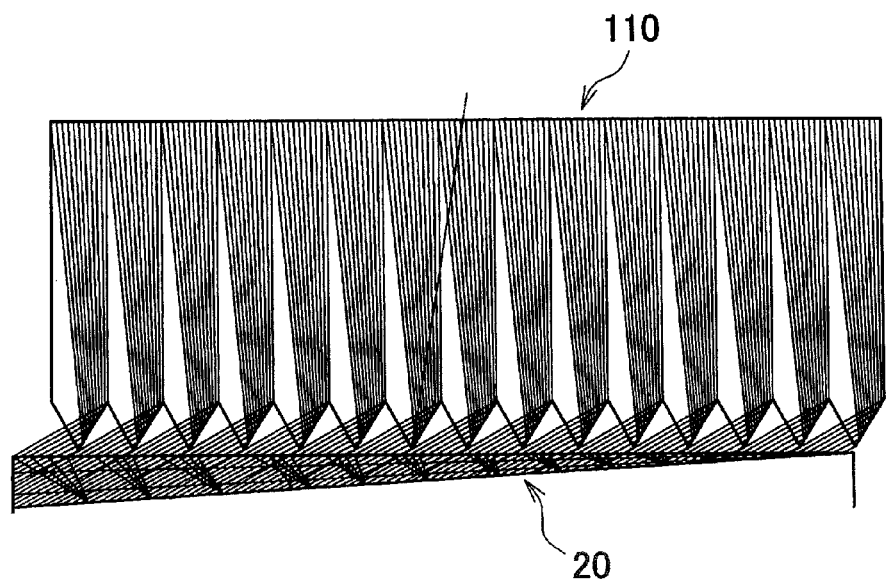
FIG. 16A is a result of a ray tracing simulation conducted by disregarding the Fresnel loss at the entrance/exit and the absorption loss at the mirror surface.
Figure 16B:
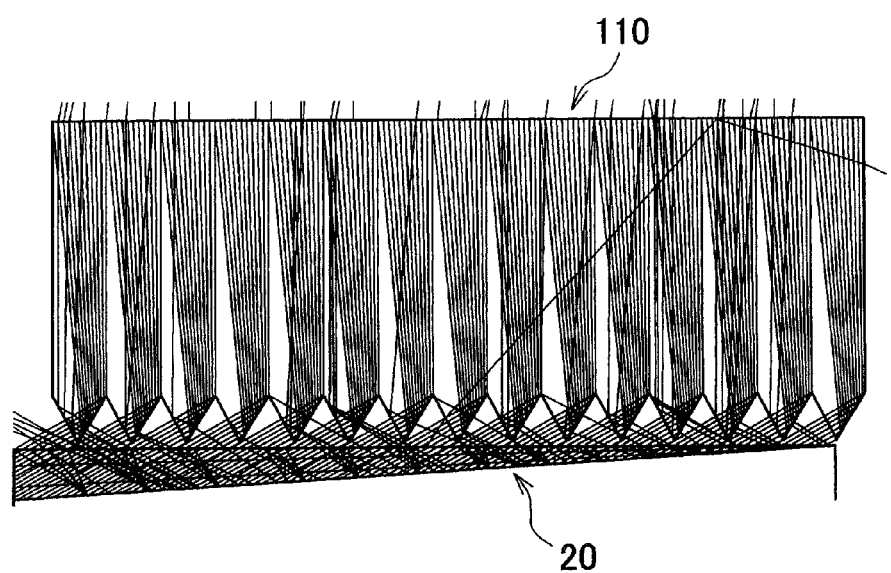
FIG. 16B is a result of a ray tracing simulation conducted by taking into consideration the Fresnel loss at the entrance/exit and the absorption loss at the mirror surface, both for the light condensing device achieved in embodiment 3.

FIG. 16A and FIG. 16B present the results of ray tracing simulation conducted under the conditions listed above. FIG. 16A presents the result of a ray tracing simulation conducted by disregarding the Fresnel loss, which occurs as rays enter and exit each prism member, and the loss attributable to absorption occurring at the mirror surface, whereas FIG. 16B presents the result of a ray tracing simulation conducted by taking into consideration the Fresnel loss occurring as rays enter and exit each prism member and the loss attributable to the absorption occurring at the mirror surface.

The simulation result obtained by disregarding the Fresnel loss occurring at the entrance/exit indicate that 99.6% of the rays of solar light, having entered the first prism member 110 from above with an angle of incidence of 0°, exit on the lower surface side of the first prism member 110 and enter the second prism member 20. The light enters the second prism member 20 with angles of incidence in a range of 55 through 73° (with an average angle of incidence of 64°). The simulation result obtained by taking into consideration the Fresnel loss at the entrance/exit indicate that 92% of the optical energy in the solar light having entered the first prism member 110 with an angle of incidence of 0° exits through the lower surface side of the first prism member 110 and enters the second prism member 20.

If there were no first prism member 110 and solar light directly entered the second prism member 20 with an angle of incidence of 64°, the optical energy in the solar light that entered through the entrance surface 21 would only amount to 43.4% of the optical energy available at the entrance surface 21 when light enters with an angle of incidence of 0° (see FIG. 3A and FIG. 3B). This means that the presence of the first prism member 110 makes it possible to more than double (increase by a factor of approximately 2.1) the optical energy of solar light entering the second prism member 20.

The light having entered the second prism member 20 with angles of incidence in the 55 through 73° range is condensed as it is reflected at the reflecting structure 22 and the entrance surface 21 before reaching the photoelectric conversion element 5 disposed at the exit surface 25. If the Fresnel loss occurring as the light enters and exits each surface and the loss attributable to absorption at the mirror surface are disregarded, 98% of the optical energy of solar light having entered the first prism member 110 from above with an angle of incidence of 0° will reach the photoelectric conversion element 5. If the Fresnel loss occurring at the entrance/exit and the loss attributable to absorption at the mirror surface are factored in, 73% of the optical energy in the solar light having entered the first prism member 110 as perpendicular incident light will reach the photoelectric conversion element 5. Accordingly, the energy condensing multiplication factor for the entire light condensing device achieved in this embodiment is calculated to be; shape-defined light condensing multiplication factor 17.3×73%=12.6. The energy condensing multiplication factor calculated for a device in which solar light directly enters the second prism member 20 instead of first entering a first prism member 110 is 5.2 when the angle of incidence is 69°, at which the shape-defined light condensing multiplication factor is at its highest.

The light condensing device 2 achieved in this embodiment, too, is capable of condensing the optical energy in solar light with a high level of efficiency while assuming a compact device configuration that includes a second prism member with a small vertex angle comparable to that in a mirror type second prism member.

Figure 17A:
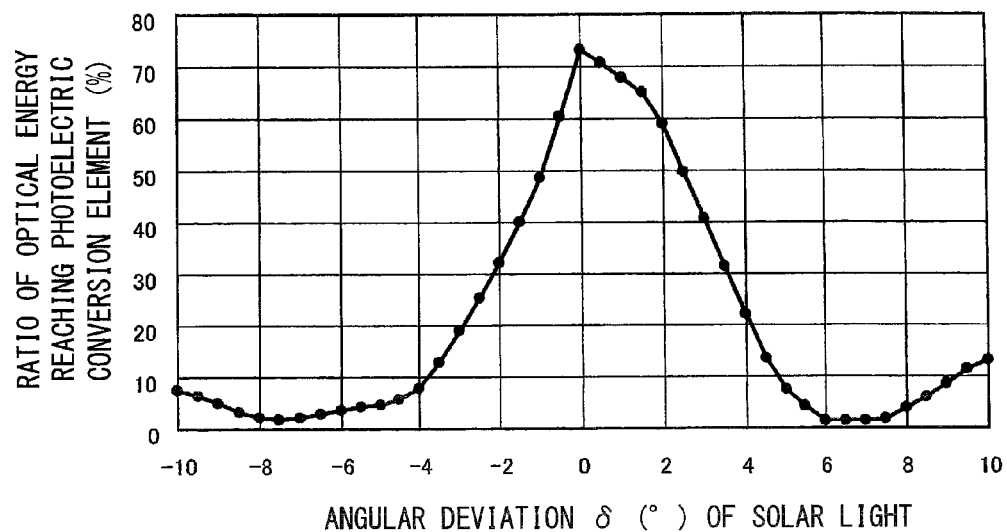
FIG. 17A is a graph providing a simulation result indicating a relationship between the angular deviation in the angle of incidence of solar light and the arrival ratio of the optical energy reaching the photoelectric conversion element simulated for the light condensing device when the direction of the incoming solar light shifts along the direction in which the optical cell units at the first prism member are arrayed in the reiterative pattern and FIG. 17B is a graph providing a simulation result indicating a relationship between the angular deviation in the angle of incidence of solar light and the arrival ratio of the optical energy reaching the photoelectric conversion element simulated for the light condensing device when the direction of the incoming solar light shifts within a plane ranging perpendicular to the direction in which the optical cell units in the first prism member are arrayed in the reiterative pattern, both for the light condensing device achieved in embodiment 3.
Figure 17B:
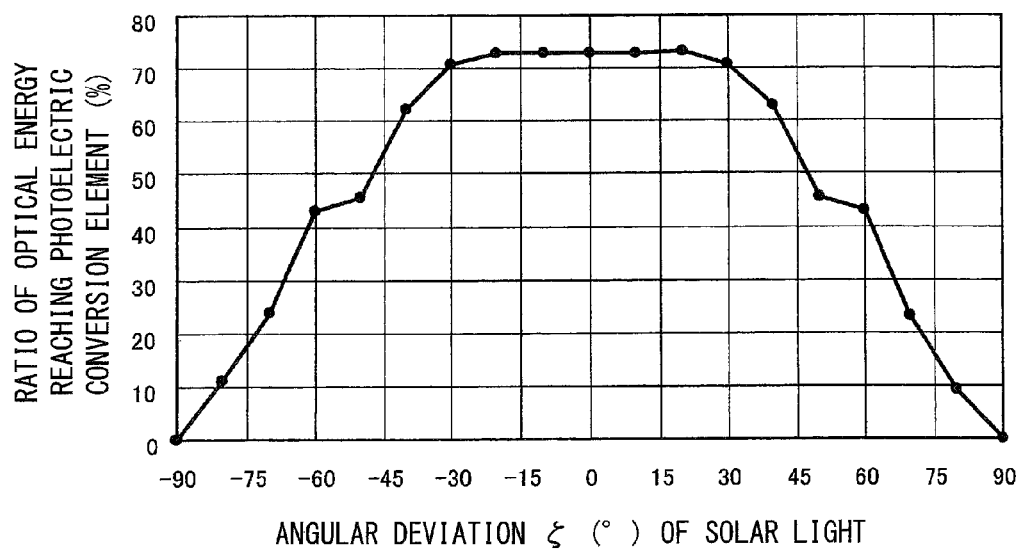

FIG. 17A and FIG. 17B present simulation results indicating how the ratio of optical energy reaching the photoelectric conversion element 5 changes as the angle of incidence of solar light entering the first prism member 110 through its upper surface as perpendicular incident light changes in the light condensing device 2 achieved in embodiment 3. FIG. 17A is a graph providing simulation result indicating an optical energy arrival ratio, which shows how the ratio of optical energy reaching the photoelectric conversion element 5 changes if the entrance direction of the solar light entering the first prism member 110 shifts to the left/right within a range of ±δ° within the drawing sheet on which each figure among FIGS. 14 through 16 is presented (i.e., if the light entrance direction deviates relative to perpendicular entrance, within the range of ±δ° along the direction in which the optical cell units in the first prism member are reiteratively arrayed). The solar light entrance direction shift is indicated with the signs assigned in line with the sign assignment in FIG. 5. FIG. 17B is a graph providing simulation result indicating optical energy arrival rates, which shows how the ratio of optical energy reaching the photoelectric conversion element 5 changes if the entrance direction of the solar light entering the first prism member 110 shifts to the front/rear within a range of ±ζ° relative to the perpendicular entrance within a plane ranging perpendicular to the drawing sheet on which each figure among FIGS. 14 through 16 is presented (i.e., if the light entrance direction deviates relative to the perpendicular entrance, within the range of ±ζ° within the plane perpendicular to the direction in which the optical cell units in the first prism member are reiteratively arrayed). FIG. 17A and FIG. 17B both indicate arrival rates relative to the optical energy of solar light entering the first prism member 110 through its upper surface set at 100%, which were calculated through simulation conducted by taking into consideration the Fresnel loss occurring at the entrance/exit surfaces and the loss attributable to absorption occurring at the mirror surface.

FIG. 17A indicates that when the angle of incidence of solar light entering the first prism member 110 changes along the direction in which the plurality of optical cell units are arrayed in the reiterative pattern, the ratio of optical energy reaching the photoelectric conversion element 5 drops drastically. However, the ratio decreases somewhat more gently when the angular deviation δ occurs along the positive direction, i.e., when the angle of incidence of the solar light changes toward the vertex of the second prism member 20, compared to the extent of decrease occurring when the angular deviation δ manifests along the negative direction, i.e., when the angle of incidence of the solar light changes towards the exit surface of the second prism member 20. FIG. 17B, on the other hand, indicates that when the solar light entering the first prism member 110 shifts by ±ζ° within the plane ranging perpendicular to the direction along which the plurality of optical cell units are disposed in the reiterative pattern, the ratio of optical energy reaching the photoelectric conversion element 5 does not greatly change as long as the angular deviation ζ remains within a range of approximately ±30° and thus, a high level of efficiency is assured over a fairly wide angular range.

As described above, it has been verified that the light condensing device 2 is capable of condensing optical energy in solar light having entered therein with the angle of incidence of 0°, with high efficiency. In addition, the light condensing device 2 adopts a structure achieved by arraying a plurality of optical cell units, made up with light condensing structures and deflecting structures with uniform sectional shapes viewed along a given direction, in a reiterative pattern and thus, a fairly significant installation angular error and tracking angular error can be tolerated along the direction running perpendicular to the direction in which the plurality of optical cell units are reiteratively arrayed.

Figure 18:
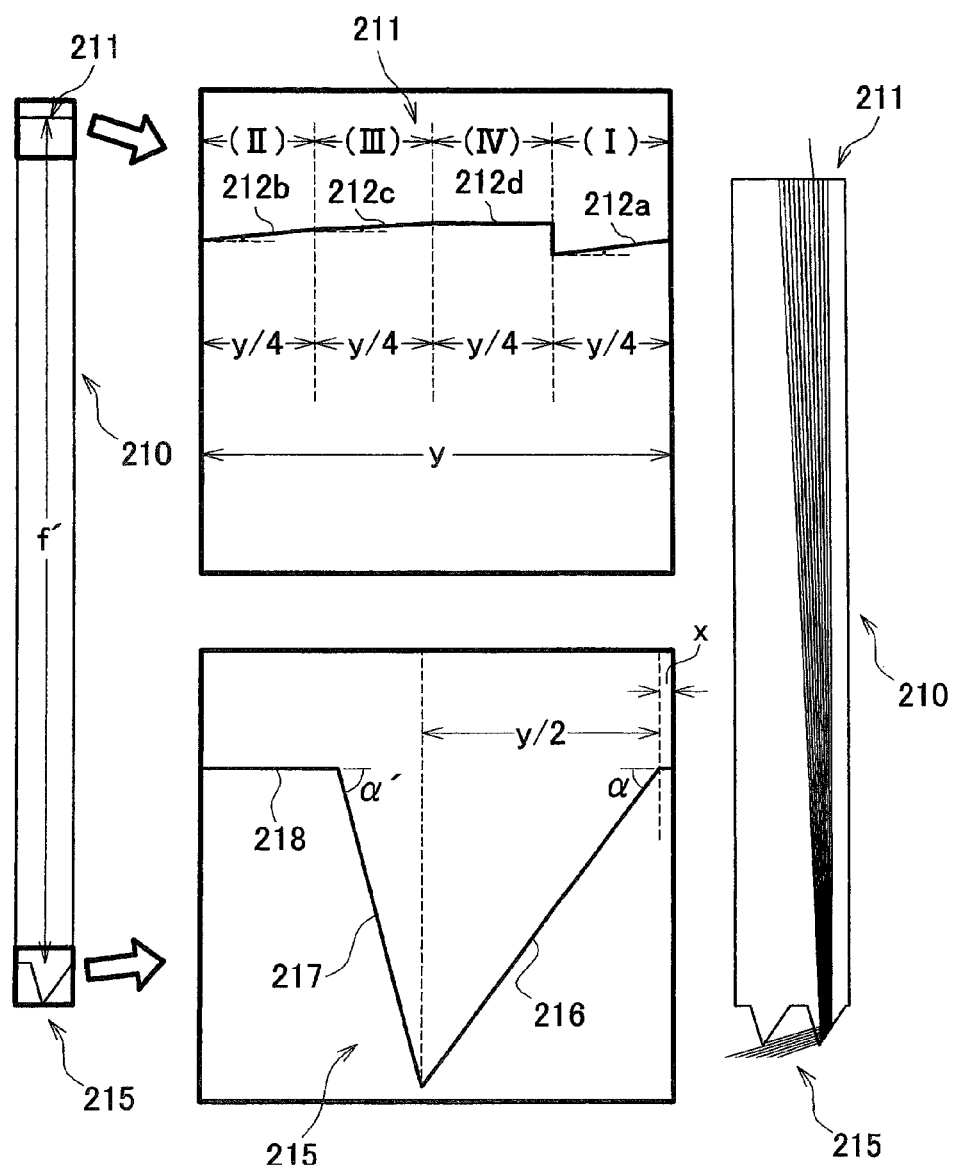
FIG. 18 is an illustration in reference to which the structures and the functions of the light condensing structures and the deflecting structures of the first prism member achieved as a second structural example adopting the second structure mode will be described.

Next, a first prism member 210 adopting the second structure mode, achieved as a second structural example, will be described in reference to FIG. 18. FIG. 18 provides an illustration in reference to which the structure and the functions of the first prism member 210 adopting the second structure mode will be explained and an enlarged view of part of the first prism member 210. FIG. 18 shows an optical cell unit made up with a pair of structural members, i.e., a light condensing structure 211, and a deflecting structure 215, parts of the light condensing structure 211 and the deflecting structure 215 in enlargements, and the advancing path of rays of light having entered the optical cell unit.

The primary structural elements configuring the first prism member 210 are a plurality of light condensing structures 211, 211, . . . that condense light having entered therein and a plurality of deflecting structures 215, 215, . . . each corresponding to one of the light condensing structures and projecting out at the rear surface.

The light condensing structures 211 each achieve a protruding structure, formed with a plurality of flat surfaces ranging along the direction perpendicular to the drawing sheet on which FIG. 18 is presented. To describe this in further detail, each light condensing structure 211 is formed with four surfaces, an A surface 212a, a B surface 212b adjacent to the A surface 212a, a C surface 212c adjacent to the B surface 212b and a D surface 212d adjacent to the C surface 212c, as indicated in the partial enlargement in FIG. 18. The first prism member 210 includes the plurality of light condensing structures 211 each made up with these four surfaces, disposed in a reiterative pattern along the direction running toward the left edge and the right edge of the drawing sheet. It is to be noted that while the A surface 212a is shown at the right end in the enlargement of the light condensing structure, this simply reflects the positional relation to the deflecting structure.

The D surface 212d, ranging perpendicular to the light entrance direction, is formed over an approximate range of y/4, with y representing the width of the optical cell unit, measured along the left/right direction. The C surface 212c, which is a flat surface assuming a predetermined angle of inclination relative to the D surface, is formed within an approximate range of y/4 so as to connect with the D surface 212d. The B surface 212b, which is a flat surface achieving an angle of inclination relative to the D surface greater than that of the C surface 212c is formed within an approximate range of y/4 so as to connect with the C surface 212c. The A surface 212a, which is a flat surface achieving an angle of inclination relative to the D surface even greater than that of the B surface 212b is formed within an approximate range of y/4 so as to connect with the B surface 212b.

The deflecting structures 215 each include a first surface 216 at which light having been condensed via the corresponding light condensing structure 211 is reflected and a second surface 217 through which the light with the advancing path thereof deflected after being reflected at the first service 216 is transmitted. A sawtooth formation is achieved with the first surface 216 and the second surface 217 set in a reiterative pattern. The deflecting structures 215 are formed as triangular prisms with uniform shapes, viewed along the direction running perpendicular to the drawing sheet, with the section of the area defined by the first surface 216, the second surface 217 and a lower surface 218 ranging parallel to the upper surface (i.e., the C surface 212d) taking the shape of a triangle. Namely, the angle of inclination α of the first surface, formed by the lower surface 218 and the first surface 216, is equal to 60° and the angle of inclination α' of the second surface, formed by the lower surface 218 and the second surface 217, is equal to 60°.

In addition, the distance f between the upper surface 212d and the lower surface 218 and the angles of inclination of the A surface 212a, the B surface 212b and the C surface 212c in each light condensing structure 211, the angle of inclination α of the first surface 216, the angle of inclination α' of the second surface 217 at the first prism member 210 are set so that all the light condensed via the light condensing structure 211 is totally reflected at the first surface 216 and that light having been transmitted through the second surface 217 is allowed to enter the second prism member through its entrance surface 21 without being blocked by an adjacent deflecting structure 215.

More specifically, light entering the prism via the A surface 212a~the C surface 212c is refracted at the individual surfaces and then advances through the prism toward the first surface 216 with tilts corresponding to the angles of inclination of the individual surfaces. The angle of inclination of the A surface 212a is set so that light having entered at the left end of the A surface 212a reaches a point near the lower end of the first surface 216. Light having entered at the right end of the A surface 212a, on the other hand, reaches the first surface 216 over an intermediate area thereof along the top/bottom direction. Likewise, the B surface 212b and the C surface 212c are formed so that light having entered at the left end of either surface reaches a point near the lower end of the first surface 216 and that light having entered at the right end of either surface reaches an intermediate area of the first surface 216 along the top/bottom direction. Light having entered through the D surface 212d advances through the first prism member straight down without ever being refracted, with light having entered at the left end of the D surface reaching the lower end of the first surface 216 and light having entered at the right end of the D surface reaching an intermediate area of the first surface 216 along the top/bottom direction.

As described above, the light having entered the prism via any of the surfaces (the A surface 212a~the D surface 212d), advanced through the prism and reached the first surface 216, is totally reflected at the first surface 216, is transmitted through the second surface 217 and enters the second prism member 20 through its entrance surface 21 without being blocked by an adjacent deflecting structure 215.

The basic structure of the second prism member 20 has already been described. Namely, the second prism member 20 is configured so as to include the entrance surface 21 through which the light having exited the first prism member 210 enters, the reflecting structure surface 22, which intersects the entrance surface 21 by forming a vertex angle ε, and reflects light, the advancing path of which has been deflected via the first prism member 210, and the exit surface 25 through which light having been reflected at and guided via the reflecting structure 22 and the entrance surface 21 exits (see FIG. 8 and the like). The second prism member in a light condensing device 2', which includes the first prism member 210 adopting this structure mode, is the total reflection+mirror type second prism member having been described earlier (see FIG. 9).

In the light condensing device 2' structured as described above, solar light having entered the first prism member 210 with an angle of incidence of 0°, at which the optical energy of the incoming light is at a maximum, is deflected via the light condensing structures 211 and the deflecting structures 215 before it enters the second prism member 20. The second prism member 20, configured as a total reflection+mirror type prism member, condenses the optical energy onto the exit surface 25 with a high level of condensing efficiency. Namely, the light condensing device 2' configured as described above is capable of condensing optical energy of, for instance, solar light with a very high level of efficiency, and thus, assures improved efficiency in optical energy utilization.

Embodiment 4

Simulation was conducted for a light condensing device 2 configured with the first prism member 210 and the second prism member 20 formed so as to meet the following requirements by using a ray tracing program widely used in the area of optics to trace rays of solar light entering through the upper surface of the first prism member 210. The wavelengths and the apparent diameter of the solar light are the same as those having been described earlier, and the simulation was conducted by assuming that the central optical axes of the solar light rays entered the upper surface of the first prism member 210 at an angle of incidence θ of 0°.

First Prism Member 210
pitch a of the optical cell units×quantity: 1 [mm]×30
distance f between the upper surface and the lower surface: 15 [mm]
width and angle of inclination of the A surface 212a: 0.25 [mm], 8.1°
width and angle of inclination of the B surface 212b: 0.24 [mm], 5.4°
width and angle of inclination of the C surface 212c: 0.25 [mm], 2.8°
width and angle of inclination of the D surface 212d: 0.26 [mm], 0°
angle of inclination α of the first surface 216: 54°
angle of inclination α' of the second surface 217: 74.8°
Second Prism Member 20 (Total Reflection+Mirror Type)
length L measured along the left/right direction: 30 [mm]
vertex angle ε: 2.6°
reflectance at the mirror surface 22b: 90%

Figure 19A:
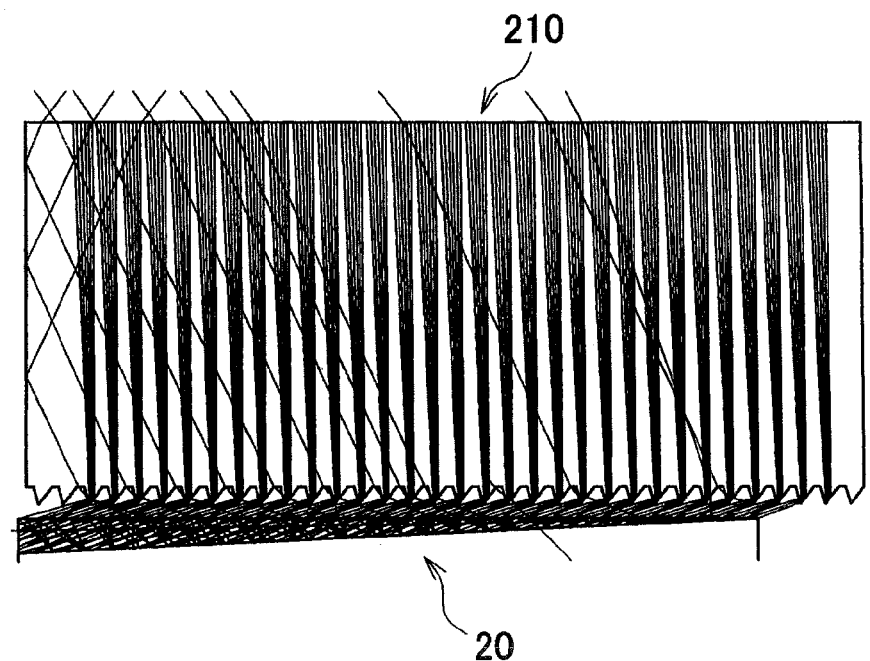
FIG. 19A is a result of a ray tracing simulation conducted by disregarding the Fresnel loss at the entrance/exit and the absorption loss at the mirror surface and FIG. 19B is a result of a ray tracing simulation conducted by taking into consideration the Fresnel loss at the entrance/exit and the absorption loss at the mirror surface, both for the light condensing device achieved in embodiment 4.
Figure 19B:
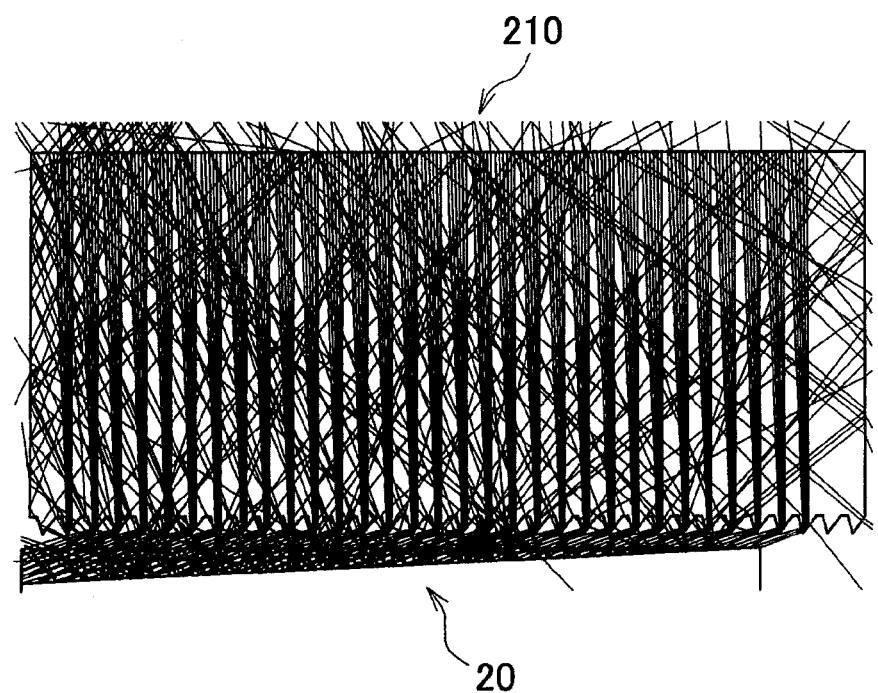

FIG. 19A and FIG. 19B present the results of ray tracing simulation conducted under the conditions listed above. FIG. 19A presents the result of a ray tracing simulation conducted by disregarding the Fresnel loss, which occurs as rays enter and exit each prism member, and the loss attributable to absorption occurring at the mirror surface, whereas FIG. 19B presents the result of a ray tracing simulation conducted by taking into consideration the Fresnel loss occurring as rays enter and exit each prism member and the loss attributable to the absorption occurring at the mirror surface.

The simulation result obtained by disregarding the Fresnel loss occurring at the entrance/exit indicate that 98% of the rays of solar light, having entered the first prism member from above with an angle of incidence of 0°, exit on the lower surface side of the first prism member 210 and enter the second prism member 20. The light enters the second prism member 20 with angles of incidence in a range of 69 through 76° (with an average angle of incidence of 71°). The simulation result obtained by taking into consideration the Fresnel loss at the entrance/exit indicate that 91% of the optical energy in the solar light having entered the first prism member 210 with an angle of incidence of 0° exits through the lower surface side of the first prism member 210 and enters the second prism 20.

If there were no first prism member 210 and solar light directly entered the second prism member 20 with an angle of incidence of 71°, the optical energy in the solar light that entered through the entrance surface 21 would only amount to 33% of the optical energy entering the entrance surface 21 when light enters with an angle of incidence of 0° (see FIG. 3A and FIG. 3B). This means that the presence of the first prism member 210 makes it possible to more than double (increase by a factor of approximately 2.8) the optical energy of solar light entering the second prism member 20.

The light having entered the second prism member 20 with angles of incidence in the 69 through 76° range is condensed as it is reflected at the reflecting structure 22 and the entrance surface 21 before reaching the photoelectric conversion element 5 disposed at the exit surface 25. If the Fresnel loss occurring as the light enters and exits each surface and the loss attributable to absorption at the mirror surface are disregarded, 96% of the optical energy of solar light having entered the first prism member 210 as perpendicular incident light from above will reach the photoelectric conversion element 5. If the Fresnel loss occurring at the entrance/exit and the loss attributable to absorption at the mirror surface are factored in, 69% of the optical energy in the solar light having entered the first prism member 210 as perpendicular incident light will reach the photoelectric conversion element 5. Accordingly, the energy condensing multiplication factor for the entire light condensing device achieved in this embodiment is calculated to be; shape-defined light condensing multiplication factor 22.0×69%=15.2. The energy condensing multiplication factor calculated for a device in which solar light directly enters the second prism member 20 instead of first entering a first prism member 210 is 5.8 when the angle of incidence is 66°, at which the shape-defined light condensing multiplication factor is at its highest.

The light condensing device 2' achieved in this embodiment, too, is capable of condensing the optical energy in solar light with a high level of efficiency while assuming a compact device configuration that includes a second prism member with a small vertex angle comparable to that in a mirror type second prism member.

Figure 20A:
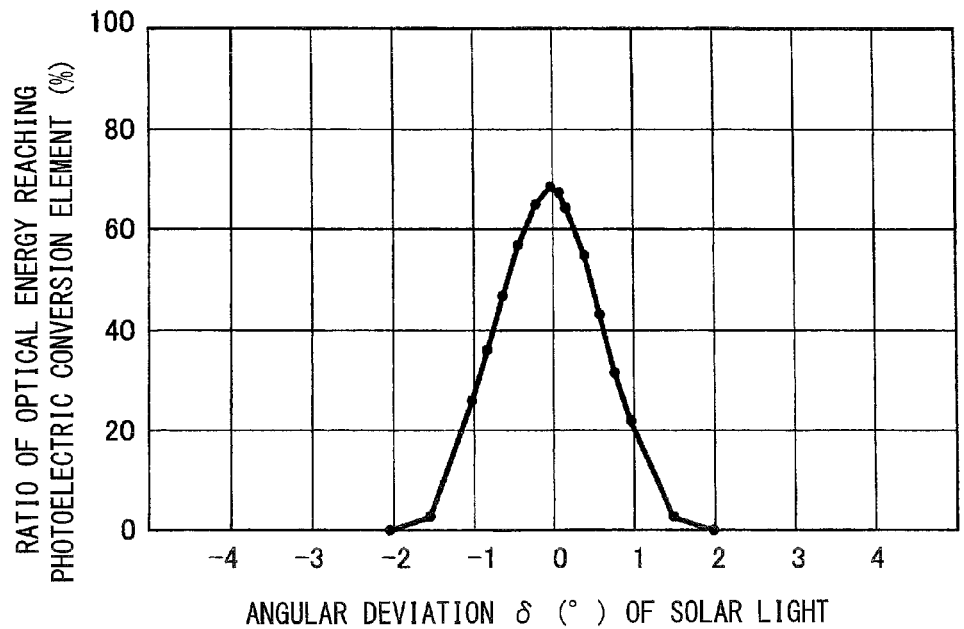
FIG. 20A is a graph presenting a simulation result indicating a relationship between the angular deviation in the angle of incidence of solar light and the arrival ratio of the optical energy reaching the photoelectric conversion element simulated for the light condensing device when the direction of the incoming solar light shifts along the direction in which the optical cell units at the first prism member are arrayed in the reiterative pattern and FIG. 20B is a graph indicating a relationship between the angular deviation in the angle of incidence of solar light and the arrival ratio of the optical energy reaching the photoelectric conversion element simulated for the light condensing device when the direction of the incoming solar light shifts within a plane ranging perpendicular to the direction in which the optical cell units in the first prism member are arrayed in the reiterative pattern, for the light condensing device achieved in embodiment 4.
Figure 20B:
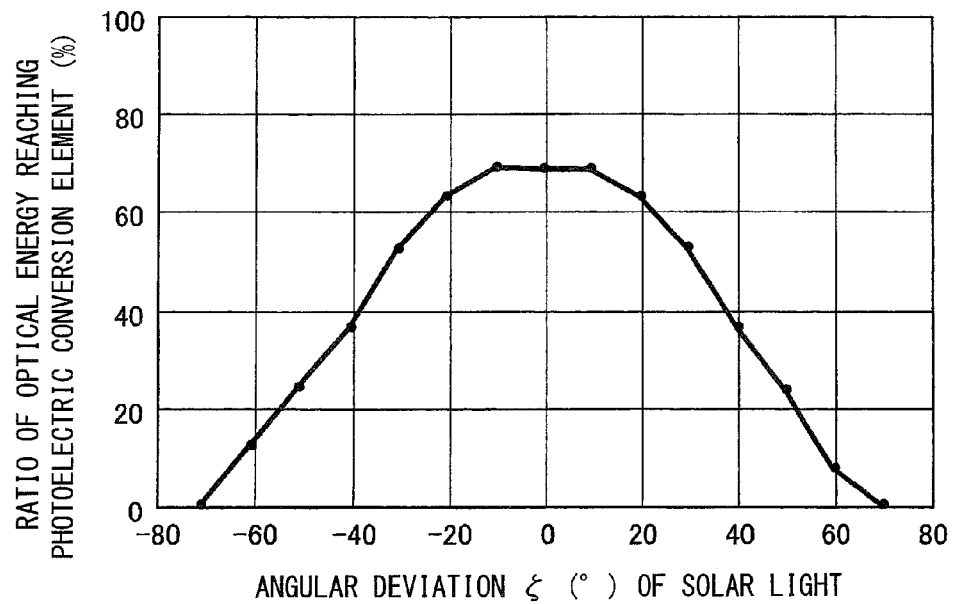

FIG. 20A and FIG. 20B present simulation results indicating how the ratio of optical energy reaching the photoelectric conversion element 5 changes as the angle of incidence of solar light entering the first prism member 210 through its upper surface as perpendicular incident light changes in the light condensing device 2' achieved in embodiment 4. FIG. 20A is a graph providing a simulation result indicating optical energy arrival rate, which shows how the ratio of optical energy reaching the photoelectric conversion element 5 changes if the entrance direction of the solar light entering the first prism member 210 shifts to the left/right within a range of $\pm \delta°$ relative to the perpendicular entrance within the drawing sheet on which each of FIGS. 18 and 19 is presented (i.e., if the light entrance direction deviates relative to the perpendicular entrance, within the range of $\pm \delta°$ along the direction in which the optical cell units in the first prism member are reiteratively arrayed). The solar light entrance direction shift is indicated with the signs assigned in line with the sign assignment in FIG. 5. FIG. 20B is a graph providing a simulation result indicating optical energy arrival rates, which shows how the ratio of optical energy reaching the photoelectric conversion element 5 changes if the entrance direction of the solar light entering the first prism member 210 shifts to the front/rear within a range of $\pm \zeta°$ relative to the perpendicular entrance within a plane ranging perpendicular to the drawing sheet on which each of FIGS. 18 and 19 is presented (i.e., if the light entrance direction deviates relative to the perpendicular entrance, within the range of $\pm \zeta°$ within a plane perpendicular to the direction in which the optical cell units in the first prism member are reiteratively arrayed). FIG. 20A and FIG. 20B both indicate arrival rates relative to the optical energy of solar light entering the first prism member 210 through its upper surface set at 100%, which were calculated through simulation conducted by taking into consideration the Fresnel loss occurring at the entrance/exit surfaces and the loss attributable to absorption occurring at the mirror surface.

FIG. 20A indicates that when the angle of incidence of solar light entering the first prism member 210 changes along the direction in which the plurality of optical cell units are arrayed in the reiterative pattern, the ratio of optical energy reaching the photoelectric conversion element 5 drops drastically. The extent of decrease occurring when the angular deviation $\delta$ manifests along the positive direction and the extent of decrease occurring when the angular deviation $\delta$ manifests along the negative direction are substantially equal. FIG. 20B, on the other hand, indicates that when the solar light entering the first prism member 210 shifts by $\pm \zeta°$ within the plane ranging perpendicular to the direction along which the plurality of optical cell units are disposed in the reiterative pattern, the ratio of optical energy reaching the photoelectric conversion element 5 does not greatly change as long as the angular deviation $\zeta$ remains within a range of approximately $\pm 20°$ and thus, a high level of efficiency is assured over a fairly wide angular range.

As described above, it has been verified that the light condensing device 2' achieved in embodiment 4 is also capable of condensing optical energy in solar light having entered therein with an angle of incidence of 0° with high efficiency. In addition, the light condensing device 2' adopts a structure achieved by arraying a plurality of optical cell units, made up with light condensing structures and deflecting structures with uniform sectional shapes along a given direction, in a reiterative pattern, and thus, fairly significant errors in installation angle and tracking angle can be tolerated along the direction running perpendicular to the direction in which the optical cell units are reiteratively arrayed.

While an explanation has been given by assuming that the second prism member 20 is configured as a total reflection+ mirror type prism member, the present invention may be adopted in a light condensing device that includes a second prism member 20 configured as a total reflection type prism member or a mirror type prism member.

(First Prism Member and Second Prism Member Adopting a Third Structure Mode)

Figure 23:
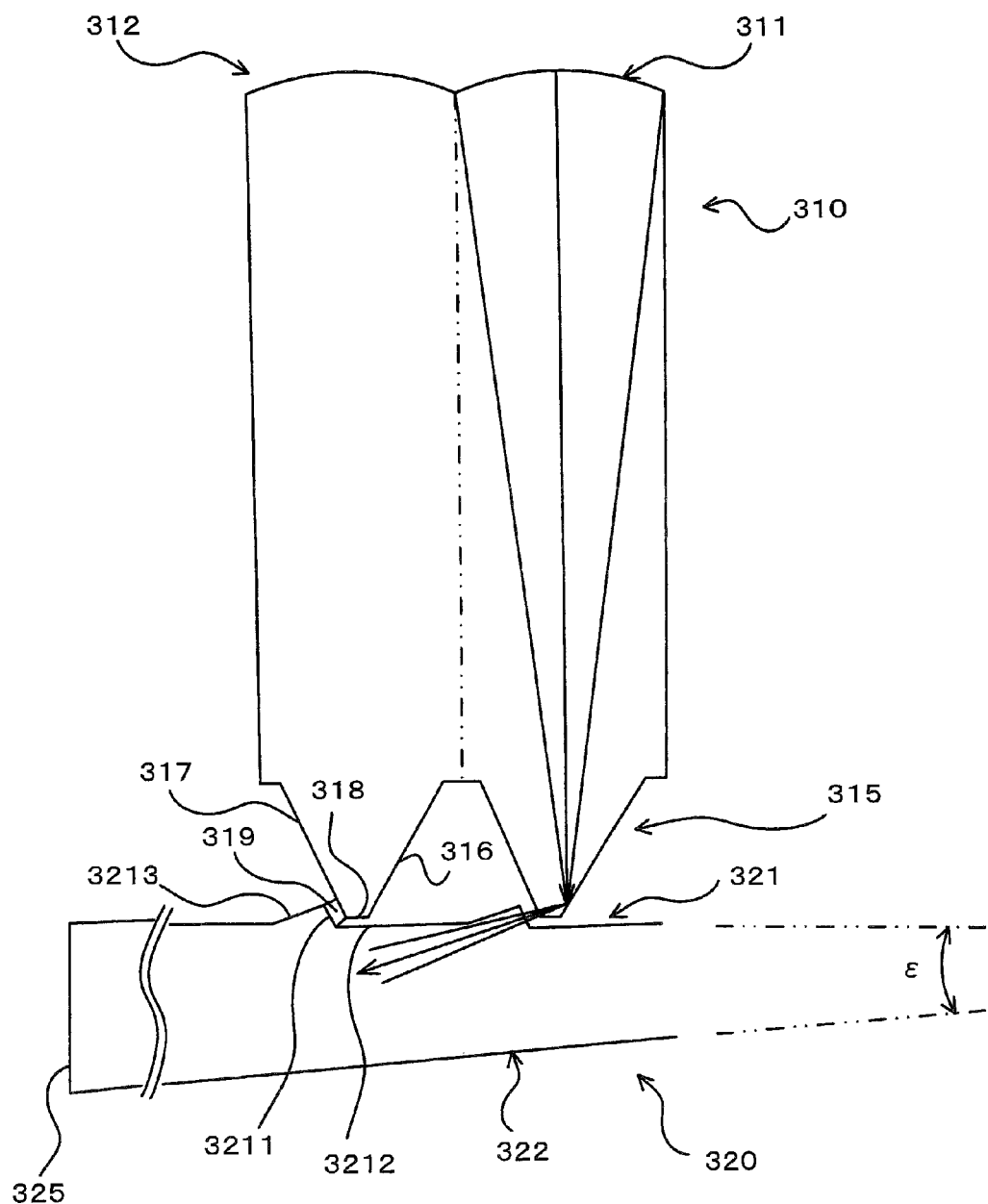
FIG. 23 is an illustration in reference to which the functions of the light condensing structures and the deflecting structures of the first prism member and the second prism member, both adopting a third structure mode, will be described.

Next, a deflection configuration achieved in conjunction with a first prism member 310 and a second prism member 320, both adopting the third structure mode, will be described in reference to FIG. 23. FIG. 23 provides an illustration in reference to which the structures and the functions of the first prism member 310 and the second prism member 320 adopting the third structure mode will be described.

Light condensing structures 311 of the first prism member 310 are similar to the light condensing structures 11 shown in FIG. 5. A plurality of deflecting structures 315 are disposed on the light exit surface side, each in correspondence to one of the plurality of light condensing structures 311. Each optical cell unit is configured with a pair of structural elements, i.e., a light condensing structure 311 and a deflecting structure 315 facing opposite each other. The deflecting structures 315 each include a first surface 316 at which light having been condensed via the corresponding light condensing structure 311 is reflected, a second surface 317 through which light, the advancing path of which has been deflected after being reflected at the first surface, is transmitted, and a third surface 318 connecting the first surface 316 and the second surface 317. As the first surface, the second surface and the third surface are set in a reiterative pattern, a sawtooth formation is achieved.

The second prism member 320 includes an entrance surface 321 set so as to face opposite the exit side of the first prism member 310, a reflecting structure 322 that intersects the entrance surface 321 by forming an acute angle, and an exit surface 325 through which light, having been reflected at the reflecting structure 322 and the entrance surface 321 and guided sideways, exits. The entrance surface 321 is made up with a light-guiding surface 3211 via which light having exited the first prism member 310 and entered therein is guided toward the reflecting structure 322, a reflecting surface 3212 at which light having been reflected at the reflecting structure 322 is totally reflected toward the inside of the second prism member 320, and a connecting surface 3213 that connects the light guiding surface 3211 and the reflecting surface 3212. It is desirable that the reflecting surface 3212 range parallel to the reflecting structure 322. These structural features make it possible to ensure that total reflection occurs between the reflecting surface 3212 and the reflecting structure 322 with a high level of reliability.

In a light condensing device 3, it is desirable that the light guiding surface 3211 of the second prism member 320 be set so as to range parallel to the second surface 317 of the first prism member 310 and that a bonding portion 319, having a refractive index matching that of the first prism member 310 and that of the second prism member 320 or close to the refractive indices of those members, be disposed between the light guiding surface 3211 of the second prism member 320 and the second surface 317 of the first prism member 310. The presence of this bonding portion 319 makes it possible to prevent reflection of light at the second surface 317 of the first prism member and at the light guiding surface 3211 of the second prism member 320 and thus assure a high level of light condensing efficiency. Balsam or an ultraviolet-curable resin may be used for the bonding agent.

The refractive index of a medium present between the third surface 318 of the first prism member 310 and the reflecting surface 3212 of the second prism member 320 in the light condensing device 3 must be lower than the refractive indices of both the first prism member 310 and the second prism member, since total reflection needs to occur between the third surface 318 of the first prism member 310 and the reflecting surface 3212 of the second prism member 320. While it is desirable that the medium be air, a material with a low refractive index may be used in certain cases.

Light having entered the first prism member 310 is condensed at each light condensing structure 311 before it reaches the first surface 316. The light is then totally reflected at the first surface 316, exits through the second surface 317, enters the second prism member 320 through the light guiding surface 3211 of the second prism member 320 and advances through the second prism member 320. Upon reaching the reflecting structure 322, the light is reflected at the reflecting structure 322, and is then totally reflected at the reflecting surface 3212. As this process of reflection at the reflecting structure 322 and total reflection at the reflecting surface 3212 is repeated, the light is ultimately condensed onto the exit surface 325. The light condensing device 3 that includes the first prism member 310 and the second prism member 320 adopting the third structure mode is capable of condensing optical energy such as the energy of solar light with a very high level of efficiency and assuring highly efficient utilization of the optical energy.

The reflecting structure 322 of the second prism member 320 may be a total reflection+mirror type structure or it may be a total reflection type structure.

(Methods Adopted when Extracting Optical Energy from Light Condensing Devices)

The photoelectric conversion device PVS described above includes the photoelectric conversion element 5 disposed at the exit surface 25 of the second prism member 20 so as to take light, having been condensed by the light condensing device 1, 2 or 2', into the photoelectric conversion element 5 where the light undergoes photoelectric conversion and thus to extract electric energy resulting from the photoelectric conversion. However, the present invention is not limited to this example and the light condensing device according to the present invention may be adopted in conjunction with another energy extraction method or utilization method. The following is a description of examples in which the light condensing device 1, 2 or 2' is adopted in conjunction with alternative energy extraction methods, given in reference to FIGS. 21A through 21E illustrating the concepts of these methods.

Figure 21A:
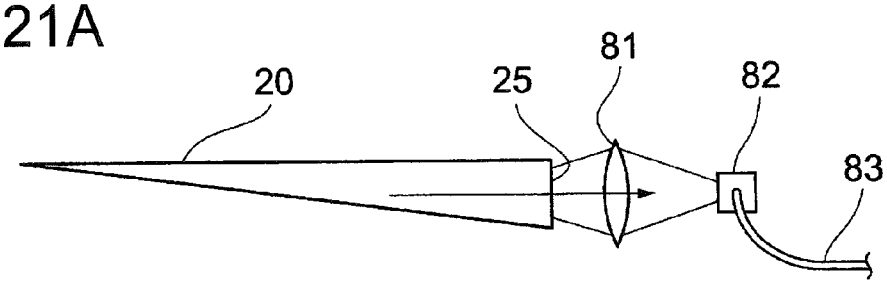
FIG. 21A, FIG. 21B, FIG. 21C, FIG. 21D and FIG. 21E are conceptual diagrams illustrating how optical energy may be extracted from the light condensing device.

FIG. 21A provides a conceptual diagram of an application example in which light having been condensed at an end of the second prism member 20 is extracted through the exit surface 25 thereof and is directly utilized as light. In the structure achieved in this application example, the light exiting through the exit surface 25 of the second prism member 20 is further condensed via a cylindrical lens 81, a light condensing rod 82 and the like, and the condensed light is guided to a desired position through an optical fiber 83.

Figure 21B:

FIG. 21B provides a conceptual diagram of a first application example in which light having been condensed at the exit surface 25 of the second prism member 20 is converted to electric energy or thermal energy and is utilized as such. In the structure shown in FIG. 21B, the photoelectric conversion element 5 is bonded to the exit surface 25 of the second prism member 20 so as to allow electric energy to be extracted. It is to be noted that a photo-thermal conversion device that extracts condensed light as thermal energy should be configured with a photo-thermal conversion element where the condensed light is converted to thermal energy through photo-thermal conversion. Such a photo-thermal conversion element is ideally constituted with a heat pipe or the like that includes a light absorber.

Figure 21C:

FIG. 21C provides a conceptual diagram of a second application example in which light having been condensed at the exit surface 25 of the second prism member 20 is converted to electric energy or thermal energy and is utilized as such. In this application example, the exit surface 25 is formed by slicing an end of the second prism member 20 along a diagonal direction, a mirror 84 is disposed along the exit surface 25 (or a reflecting film is formed at the exit surface 25) and light is condensed onto the photoelectric conversion element 5 disposed on the upper surface side (or the lower surface side) of the second prism member 20. These structural features allow a photoelectric conversion element 5 having a relatively large area to be mounted even when the dimension of the second prism member 20, measured along its thickness, is small. It is to be noted that the condensed light may be extracted as thermal energy in an ideal manner via, for instance, a heat pipe that includes a light absorber.

Figure 21D:
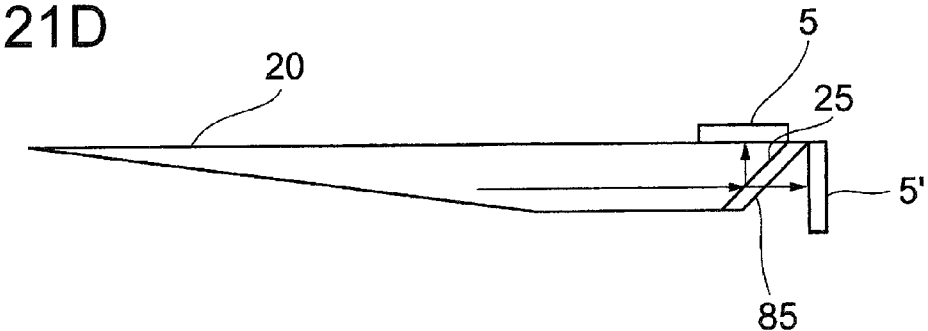

FIG. 21D provides a conceptual diagram of a third application example in which light having been condensed at the exit surface 25 of the second prism member 20 is converted to electric energy or thermal energy and is utilized as such. In this application example, the exit surface 25 is formed by slicing an end of the second prism member 20 along a diagonal direction, a dichroic mirror 85 is disposed along the exit surface 25 (or a reflecting film with wavelength selectivity is formed at the exit surface 25) and light is split and condensed at two separate photoelectric conversion elements, i.e., a photoelectric conversion element 5 disposed on the upper surface side (or the lower surface side) of the second prism member 20 and a photoelectric conversion element 5' disposed at the side of the second prism member 20. Such structural features, which include highly efficient photoelectric conversion elements corresponding to different wavelength ranges, make it possible to configure a photovoltaic power generation device assuring high conversion efficiency at relatively low cost.

It is to be noted that in another desirable application example, light corresponding to one of the two different wavelength ranges (e.g., light in the infrared range) may be input to a heat pipe equipped with a light absorber or the like so as to utilize it as thermal energy while light corresponding to the other range (e.g., light in the visible range and the ultraviolet range) may be input to the photoelectric conversion element 5 so as to utilize it as electric energy.

Figure 21E:
Figure 22:
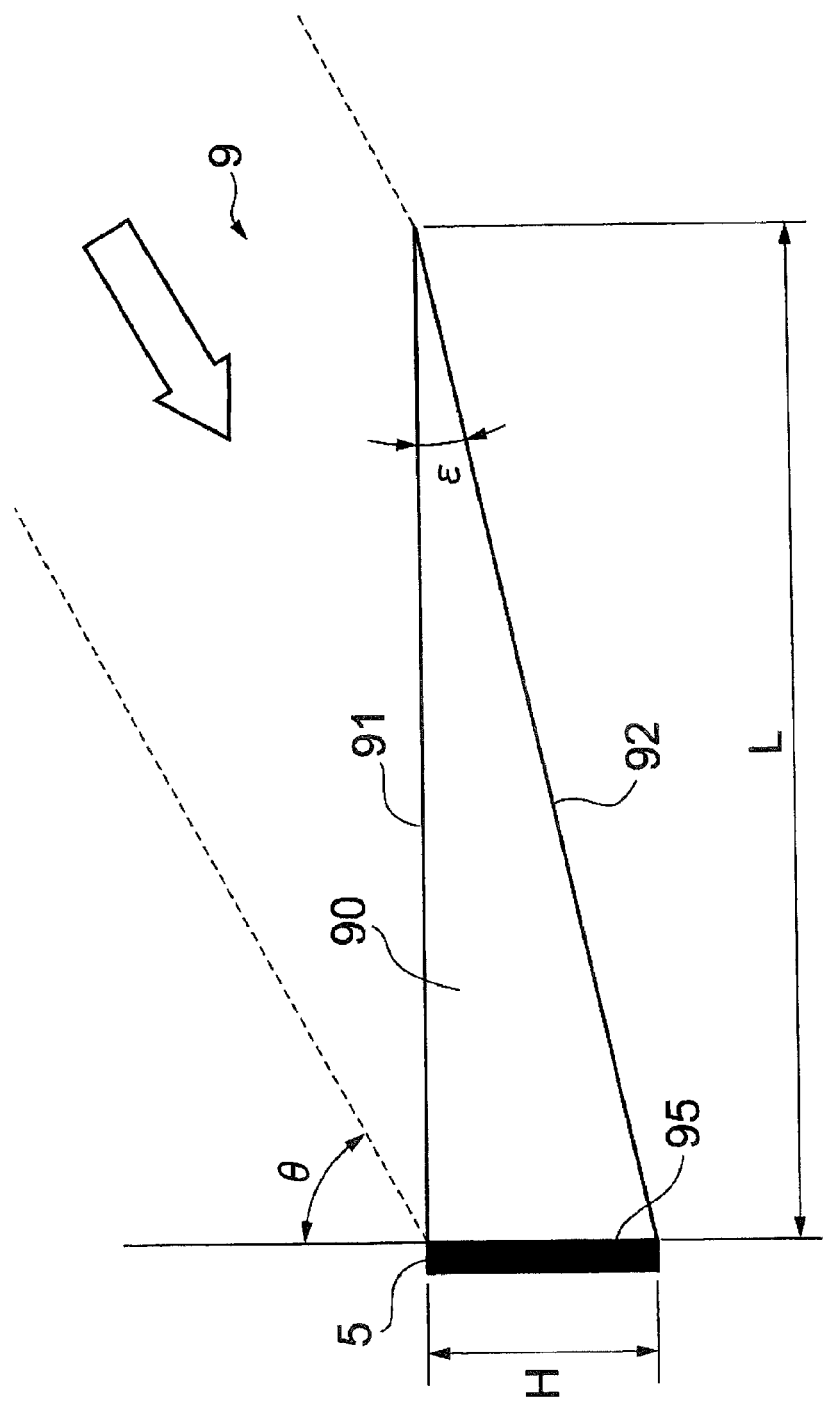
FIG. 22 is a conceptual diagram illustrating the basic concept of a light condensing device in the related art.

FIG. 21E provides a conceptual diagram of an application example in which light having been condensed at the exit surface 25 of the second prism member 20 is further condensed along the thickness-wise direction before it is extracted. The second prism member 20 in this example is formed as a parabolic member, the thickness of which gradually decreases over an area near the exit surface 25, so that light advancing through the second prism member toward the exit surface 25 is condensed along the thickness-wise direction as it is totally reflected at the curved surface on the upper side or the curved surface on the lower side. Such structural features allow condensed light to be used directly without requiring the use of a cylindrical lens or the like such as that shown in FIG. 21A. In addition, the power density (energy condensing multiplication factor) of light input to the photoelectric conversion element 5 or a heat pipe can be raised through a simple structure.

As described above, the light condensing devices 1, 2 and 2' embodying the present invention respectively include first prism member 10, the first prism member 110 and the first prism member 210, respectively configured with light condensing structures 11, 111 and 211, which condense light having entered the second prism member 20, and deflecting structures 15, 115 and 215, which deflect the condensed light and output the deflected light. The light condensing devices are each structured so that the light exiting the first prism member is allowed to enter the second prism member through its entrance surface without ever becoming blocked by adjacent deflecting structures. The light condensing device achieved in any of these embodiments is capable of condensing optical energy such as solar light with high efficiency and thus assuring improved efficiency with which optical energy is utilized.

In addition, a photovoltaic power generation device or a photo-thermal conversion device equipped with such a light condensing device 1, 2 or 2' that assumes a small thickness measured along the top/bottom direction, is achieved as a compact, lightweight unit and assures a high level of optical energy condensing efficiency can be provided as a compact photovoltaic power generation device or photo-thermal conversion device with high energy conversion efficiency.

It is to be noted that the light condensing device 1, 2 or 2' used to condense solar light may be configured so that at least light within a specific wavelength range in the solar light spectrum can be condensed. Such a wavelength range may be determined in correspondence to the spectral sensitivity characteristics of the photoelectric conversion element 5 or the absorption characteristics of the photo-thermal conversion element. Furthermore, the light condensing device may be configured so as to condense at least the light with a wavelength at which the photoelectric conversion efficiency is maximized. A specific wavelength range for the light to be condensed by the light condensing device may be, for instance, 350 through 1800 nm or 350 through 1100 nm, as has been cited in reference to the embodiments. A light condensing device that condenses light in the first wavelength range will be ideal in applications in which a multi-junction photoelectric conversion element is utilized, whereas a light condensing device that condenses light in the second wavelength range will be ideal in applications in which a crystalline silicon photoelectric conversion element is utilized.

While various embodiments of the present invention have been described above, the present invention is not to be considered as being limited by the details thereof.

What is claimed is:

1. A light condensing device, comprising:
a first prism member where light, having entered therein through a front surface thereof, exits through a rear surface thereof; and
a second prism member disposed so as to face opposite the rear surface of the first prism member, wherein:
the first prism member includes a plurality of light condensing structures that are formed at the front surface and condense the light having entered thereat and a plurality of deflecting structures, each projecting out at the rear surface in correspondence to one of the plurality of light condensing structures, which deflect light having been condensed via the light condensing structures and output the deflected light;
the second prism member includes an entrance surface set so as to face opposite the rear surface of the first prism member, a reflecting structure intersecting the entrance surface by forming an acute angle and an exit surface through which light exits; and
the light having been deflected and output by the deflecting structures of the first prism member enters the second prism member through the entrance surface of the second prism member, is guided toward the exit surface as the light is reflected at the reflecting structure and at the entrance surface inside the second prism member, and exits through the exit surface.

2. A light condensing device according to claim 1, wherein:
the deflecting structures of the first prism member each include a first surface at which the light having been condensed by the corresponding light condensing structure is reflected and a second surface through which the light having been reflected at the first surface is transmitted and exits the first prism member.

3. A light condensing device according to claim 2, wherein:
the entrance surface of the second prism member includes a light guiding surface ranging substantially parallel to and facing opposite the second surface of the deflecting structure of the first prism member, through which the light having exited the first prism member through the second surface thereof enters, and a reflecting surface at which light having been reflected at the reflecting structure is reflected toward inside the second prism member.

4. A light condensing device according to claim 3, wherein:
a bonding portion, having a refractive index substantially equal to the refractive index of the first prism member and the refractive index of the second prism member, is disposed between the second surface of the first prism member and the light guiding surface of the second prism member.

5. A light condensing device according to claim 3, wherein:
a medium, having a refractive index lower than both the refractive index of the first prism member and the refractive index of the second prism member, is disposed between the first prism member and the reflecting surface of the second prism member.

6. A light condensing device according to claim 2, wherein:
the light condensing device is configured so that;
light, having exited through the second surface after being condensed at each of the condensing structures of the first prism member and reflected at the first surface, enters the second prism member through the entrance surface thereof without ever becoming blocked by an adjacent deflecting structure of the first prism member.

7. A light condensing device according to claim 2, wherein:
the plurality of deflecting structures of the first prism member achieve a reiterative formation with the first surface and the second surface set alternately to each other.

8. A light condensing device according to claim 1, wherein:
the light condensing structures of the first prism member are each formed as a curved surface protruding on a light entrance side; and
the first surface is formed so that all the light having been condensed at the corresponding light condensing structure is totally reflected thereat.

9. A light condensing device according to claim 1, wherein:
the light condensing structures of the first prism member are each formed with a plurality of flat surfaces so as to protrude out on a light entrance side; and the first surface is formed so that all the light having been condensed at the corresponding light condensing structure is totally reflected thereat.

10. A light condensing device according to claim 1, wherein:
the reflecting structure of the second prism member is configured with a single flat surface and is structured so that when light, having advanced through the second prism member after exiting the first prism member and entering the second prism member through the entrance surface thereof, reaches the reflecting structure, the light is totally reflected at the reflecting structure.

11. A light condensing device according to claim 1, wherein:
the reflecting structure of the second prism member is configured with a flat surface and a mirror surface set so as to face opposite the flat surface via an air layer, and is structured so that when light, having advanced through the second prism member after exiting the first prism member and entering the second prism member through the entrance surface thereof, reaches the reflecting structure, the light is first transmitted through the flat surface, is reflected at the mirror surface, is transmitted through the flat surface again, advances through the second prism member and is totally reflected at the entrance surface toward inside the second prism member.

12. A photovoltaic power generation device, comprising:
a light condensing device according to claim 1; and
a photoelectric conversion element where light having been guided to the exit surface of the second prism member undergoes photoelectric conversion.

13. A photo-thermal conversion device, comprising:
a light condensing device according to claim 1; and
a photo-thermal conversion element where light having been guided to the exit surface of the second prism member undergoes photo-thermal conversion.

* * * * *